(12) United States Patent
Sugimoto et al.

(10) Patent No.: US 11,733,509 B2
(45) Date of Patent: Aug. 22, 2023

(54) OPTICAL DEVICE

(71) Applicant: HAMAMATSU PHOTONICS K.K., Hamamatsu (JP)

(72) Inventors: Tatsuya Sugimoto, Hamamatsu (JP); Tomofumi Suzuki, Hamamatsu (JP); Kyosuke Kotani, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 380 days.

(21) Appl. No.: 16/625,695

(22) PCT Filed: Jul. 6, 2018

(86) PCT No.: PCT/JP2018/025637
§ 371 (c)(1),
(2) Date: Dec. 21, 2019

(87) PCT Pub. No.: WO2019/009395
PCT Pub. Date: Jan. 10, 2019

(65) Prior Publication Data
US 2021/0155471 A1  May 27, 2021

(30) Foreign Application Priority Data

Jul. 6, 2017 (JP) ................................. 2017-133093
Dec. 7, 2017 (JP) ................................. 2017-235025

(51) Int. Cl.
*G02B 26/08* (2006.01)
*B81B 3/00* (2006.01)

(52) U.S. Cl.
CPC ...... *G02B 26/0841* (2013.01); *B81B 2201/04* (2013.01); *B81B 2203/0118* (2013.01);
(Continued)

(58) Field of Classification Search
CPC .... G02B 26/001; G02B 26/0841; B81B 3/00; B81B 2201/04; B81B 2203/0118; B81B 2203/0136; B81B 2203/0154; G01J 3/45
See application file for complete search history.

(56) References Cited

U.S. PATENT DOCUMENTS 6,507,138 B1   1/2003   Rodgers et al.
7,699,296 B1   4/2010   Knollenberg et al.
(Continued)

FOREIGN PATENT DOCUMENTS

CN   1619351 A   5/2005
CN   1650214 A   8/2005
(Continued)

OTHER PUBLICATIONS

Sun Fengming et al., "MEMS Based Micro Displacement Sensor and Its Application", Chinese Journal of Sensors and Actuators, vol. 26, No. 2, Feb. 2013, p. 293-p. 296.
(Continued)

*Primary Examiner* — Jack Dinh
(74) *Attorney, Agent, or Firm* — Faegre Drinker Biddle & Reath LLP

(57) ABSTRACT

An optical device includes an elastic support portion which includes a torsion bar which extends along a second direction perpendicular to a first direction and a nonlinearity relaxation spring which is connected between the torsion bar and a movable portion. The nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a deformation amount of the torsion bar in the third direction while the movable portion moves in the first direction. A (Continued)

comb electrode is disposed along an outer edge of the movable portion.

7 Claims, 15 Drawing Sheets

(52) U.S. Cl.
CPC ............... *B81B 2203/0136* (2013.01); *B81B 2203/0154* (2013.01)

(56) References Cited

U.S. PATENT DOCUMENTS

| | | | |
|---|---|---|---|
| 8,353,600 | B1 | 1/2013 | Fu |
| 8,729,770 | B1 | 5/2014 | Milanovic |
| 11,187,872 | B2 | 11/2021 | Sugimoto et al. |
| 2002/0109894 | A1 | 8/2002 | Clark et al. |
| 2004/0004775 | A1 | 1/2004 | Turner et al. |
| 2004/0081391 | A1 | 4/2004 | Ko et al. |
| 2004/0232107 | A1 | 11/2004 | Kouma et al. |
| 2005/0099665 | A1 | 5/2005 | Lee et al. |
| 2005/0194650 | A1 | 9/2005 | Hung |
| 2005/0194840 | A1 | 9/2005 | Mori et al. |
| 2006/0082250 | A1 | 4/2006 | Ko et al. |
| 2008/0123242 | A1 | 5/2008 | Zhou |
| 2008/0198249 | A1 | 8/2008 | Tanimura et al. |
| 2008/0247029 | A1 | 10/2008 | Zhou |
| 2008/0284078 | A1 | 11/2008 | Wolter et al. |
| 2009/0107949 | A1 | 4/2009 | Kouma et al. |
| 2009/0109512 | A1 | 4/2009 | Park |
| 2009/0225387 | A1 | 9/2009 | Mizuno et al. |
| 2010/0208347 | A1 | 8/2010 | Kouma et al. |
| 2011/0080627 | A1 | 4/2011 | He et al. |
| 2011/0090551 | A1 | 4/2011 | Pirk et al. |
| 2011/0109194 | A1 | 5/2011 | Hung et al. |
| 2011/0205608 | A1 | 8/2011 | Mizoguchi |
| 2012/0099176 | A1 | 4/2012 | Zhou |
| 2012/0160557 | A1 | 6/2012 | Yamada et al. |
| 2012/0162739 | A1 | 6/2012 | Yamada |
| 2012/0236382 | A1 | 9/2012 | Puegner et al. |
| 2013/0083379 | A1 | 4/2013 | Tanaka et al. |
| 2013/0321892 | A1 | 12/2013 | Haeberle et al. |
| 2014/0125950 | A1 | 5/2014 | Shimada et al. |
| 2014/0137670 | A1 | 5/2014 | Hata et al. |
| 2014/0300942 | A1 | 10/2014 | Van Lierop et al. |
| 2014/0327946 | A1 | 11/2014 | Van Lierop et al. |
| 2014/0355091 | A1 | 12/2014 | Mizutani |
| 2014/0362460 | A1 | 12/2014 | Nozu et al. |
| 2015/0028698 | A1 | 1/2015 | Gutierrez |
| 2015/0234176 | A1 | 8/2015 | Zhou |
| 2016/0216508 | A1 | 7/2016 | Tamamori |
| 2017/0139200 | A1 | 5/2017 | Chang et al. |

FOREIGN PATENT DOCUMENTS

| | | | |
|---|---|---|---|
| CN | 1790181 | A | 6/2006 |
| CN | 1837892 | A | 9/2006 |
| CN | 101246258 | A | 8/2008 |
| CN | 101279708 | A | 10/2008 |
| CN | 101284642 | A | 10/2008 |
| CN | 101290395 | A | 10/2008 |
| CN | 101316789 | A | 12/2008 |
| CN | 101410744 | A | 4/2009 |
| CN | 101786592 | A | 7/2010 |
| CN | 101894711 | A | 11/2010 |
| CN | 102177465 | A | 9/2011 |
| CN | 102265033 | A | 11/2011 |
| CN | 102369153 | A | 3/2012 |
| CN | 102667497 | A | 9/2012 |
| CN | 102868383 | A | 1/2013 |
| CN | 103288034 | A | 9/2013 |
| CN | 103803478 | A | 5/2014 |
| CN | 203825034 | U | 9/2014 |
| CN | 104216109 | A | 12/2014 |
| CN | 104272167 | A | 1/2015 |
| CN | 104348326 | A | 2/2015 |
| CN | 104428439 | A | 3/2015 |
| CN | 104964678 | A | 10/2015 |
| CN | 105453408 | A | 3/2016 |
| CN | 105492879 | A | 4/2016 |
| CN | 105594114 | A | 5/2016 |
| CN | 105826252 | A | 8/2016 |
| CN | 105899995 | A | 8/2016 |
| CN | 106500682 | A | 3/2017 |
| CN | 106597016 | A | 4/2017 |
| CN | 106604887 | A | 4/2017 |
| CN | 106707415 | A | 5/2017 |
| EP | 1677086 | A1 | 7/2006 |
| EP | 3015901 | A1 | 5/2016 |
| EP | 3070508 | A1 | 9/2016 |
| JP | H8-506857 | A | 7/1996 |
| JP | 2000-214407 | A | 8/2000 |
| JP | 2002-524271 | A | 8/2002 |
| JP | 2002-326197 | A | 11/2002 |
| JP | 2003-029178 | A | 1/2003 |
| JP | 2004-177543 | A | 6/2004 |
| JP | 2004-215534 | A | 8/2004 |
| JP | 2004-325578 | A | 11/2004 |
| JP | 2005-010453 | A | 1/2005 |
| JP | 2005-275198 | A | 10/2005 |
| JP | 2006-343481 | A | 12/2006 |
| JP | 2007-155965 | A | 6/2007 |
| JP | 2007-183400 | A | 7/2007 |
| JP | 2007-188073 | A | 7/2007 |
| JP | 2008-055516 | A | 3/2008 |
| JP | 2008-083122 | A | 4/2008 |
| JP | 2009-171394 | A | 7/2009 |
| JP | 2010-008611 | A | 1/2010 |
| JP | 2010-029976 | A | 2/2010 |
| JP | 2010-054944 | A | 3/2010 |
| JP | 2010-085506 | A | 4/2010 |
| JP | 2010-128116 | A | 6/2010 |
| JP | 2010-184334 | A | 8/2010 |
| JP | 2011-069954 | A | 4/2011 |
| JP | 2011-175044 | A | 9/2011 |
| JP | 2012-042666 | A | 3/2012 |
| JP | 2012-108165 | A | 6/2012 |
| JP | 2012-133242 | A | 7/2012 |
| JP | 2012-184962 | A | 9/2012 |
| JP | 2012-524295 | A | 10/2012 |
| JP | 2012-528343 | A | 11/2012 |
| JP | 2013-009447 | A | 1/2013 |
| JP | 2013-016651 | A | 1/2013 |
| JP | 2013-148707 | A | 8/2013 |
| JP | 2014-006418 | A | 1/2014 |
| JP | 2014-023207 | A | 2/2014 |
| JP | 2014-035429 | A | 2/2014 |
| JP | 2014-115267 | A | 6/2014 |
| JP | 2014-215534 | A | 11/2014 |
| JP | 2014-235260 | A | 12/2014 |
| JP | 2014-238581 | A | 12/2014 |
| JP | 2015-093340 | A | 5/2015 |
| JP | 2015-102483 | A | 6/2015 |
| JP | 2015-219516 | A | 12/2015 |
| JP | 2016-085299 | A | 5/2016 |
| JP | 2016-114798 | A | 6/2016 |
| JP | 2016-151681 | A | 8/2016 |
| JP | 2016-200834 | A | 12/2016 |
| JP | 2016-212221 | A | 12/2016 |
| JP | 2017-058418 | A | 3/2017 |
| JP | 2017-070163 | A | 4/2017 |
| JP | 2017-129783 | A | 7/2017 |
| TW | 201531709 | A | 8/2015 |
| TW | I563290 | B | 12/2016 |
| TW | 201717371 | A | 5/2017 |
| TW | 201718896 | A | 6/2017 |
| TW | I588533 | B | 6/2017 |
| WO | WO 94/018697 | A1 | 8/1994 |
| WO | WO-00/013210 | A2 | 3/2000 |
| WO | WO 2009/124607 | A1 | 10/2009 |
| WO | WO-2010/121185 | A1 | 10/2010 |
| WO | WO-2010/136358 | A2 | 12/2010 |
| WO | WO 2011/091012 | A2 | 7/2011 |

(56) References Cited

FOREIGN PATENT DOCUMENTS

| WO | WO-2013/046612 A1 | 4/2013 |
|---|---|---|
| WO | WO 2015/068400 A1 | 5/2015 |
| WO | WO 2016/002453 A1 | 1/2016 |

OTHER PUBLICATIONS

Sandner, Thilo et al., "Out-of-plane translatory MEMS actuator with extraordinary large stroke for optical path length modulation in miniaturized FTIR Spectrometers," SENSOR+TEST Conferences 2011, Proceedings IRS2, Jun. 9, 2011, pp. 151-156.
International Preliminary Report on Patentability dated Jan. 16, 2020 for PCT/JP2018/025637.
International Preliminary Report on Patentability dated Jan. 16, 2020 for PCT/JP2018/025635.
International Preliminary Report on Patentability dated Jan. 16, 2020 for PCT/JP2018/025636.
International Preliminary Report on Patentability dated Jan. 16, 2020 for PCT/JP2018/025640.
International Preliminary Report on Patentability dated Jan. 16, 2020 for PCT/JP2018/025634.
International Preliminary Report on Patentability dated Jan. 16, 2020 for PCT/JP2018/025638.
International Preliminary Report on Patentability dated Jan. 16, 2020 for PCT/JP2018/025639.
Sandner Thilo et al. "Translatory MEMS actuator and their system integration for miniaturized Fourier transform spectrometers", Moems and Miniaturized Systems XI, SPIE, 1000 20th St. Bellingham WA 98225-6705 USA, vol. 8252, No. 1, Mar. 8, 2012, p. 1-p. 10, XP060023646.
English-language translation of International Preliminary Report on Patentability (IPRP) dated May 28, 2020 that issued in WO Patent Application No. PCT/JP2018/032760.
International Preliminary Report on Patentability dated May 28, 2020 for PCT/JP2018/029117.
Akin Aydemir et al., "A new design and a fabrication approach to realize a high performance three axes capacitive MEMS accelerometer", Sensors and Actuators A Physical, vol. 244, Jun. 15, 2016, p. 324-p. 333.
Anonymous, "Michelson Interferometer—Definition and Applications", URL:https://www.azooptics.com/Article.aspx?Article1D=698, May 6, 2014, XP093017159.

*Fig.6*
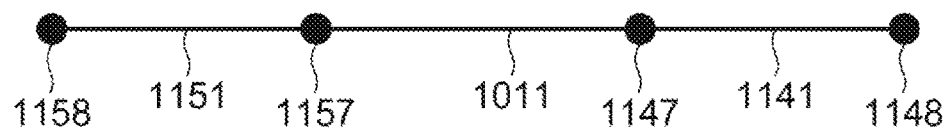
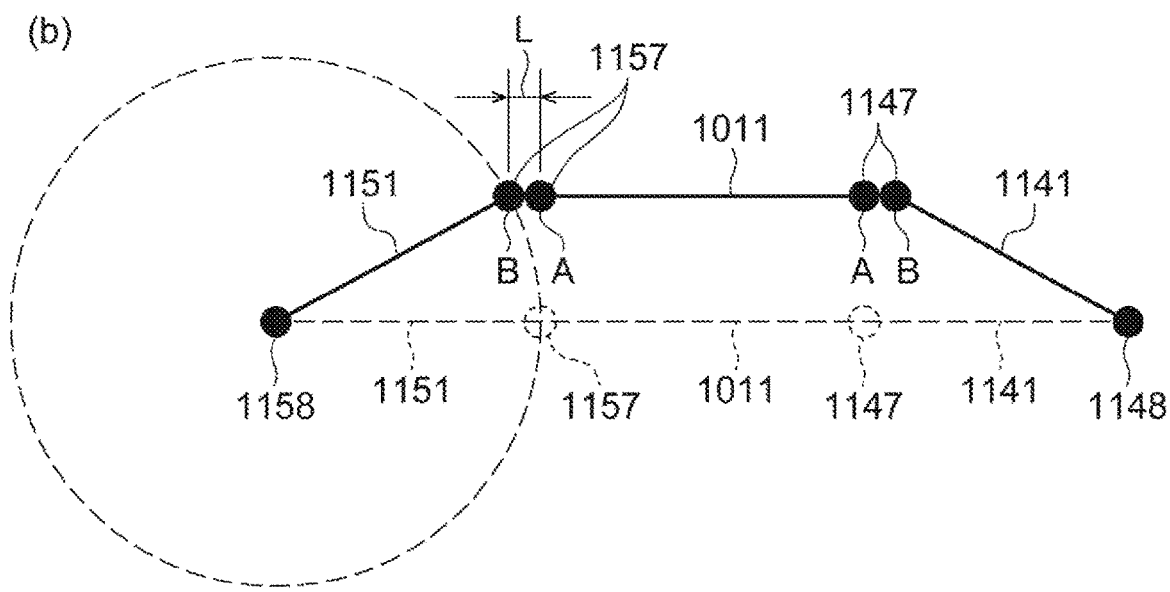

Fig.7
(a)
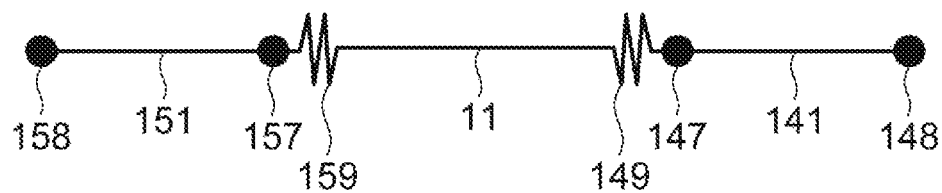
(b)
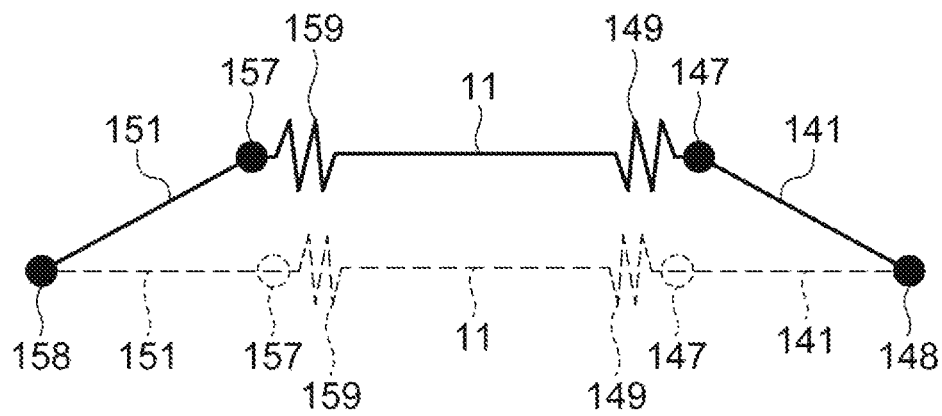

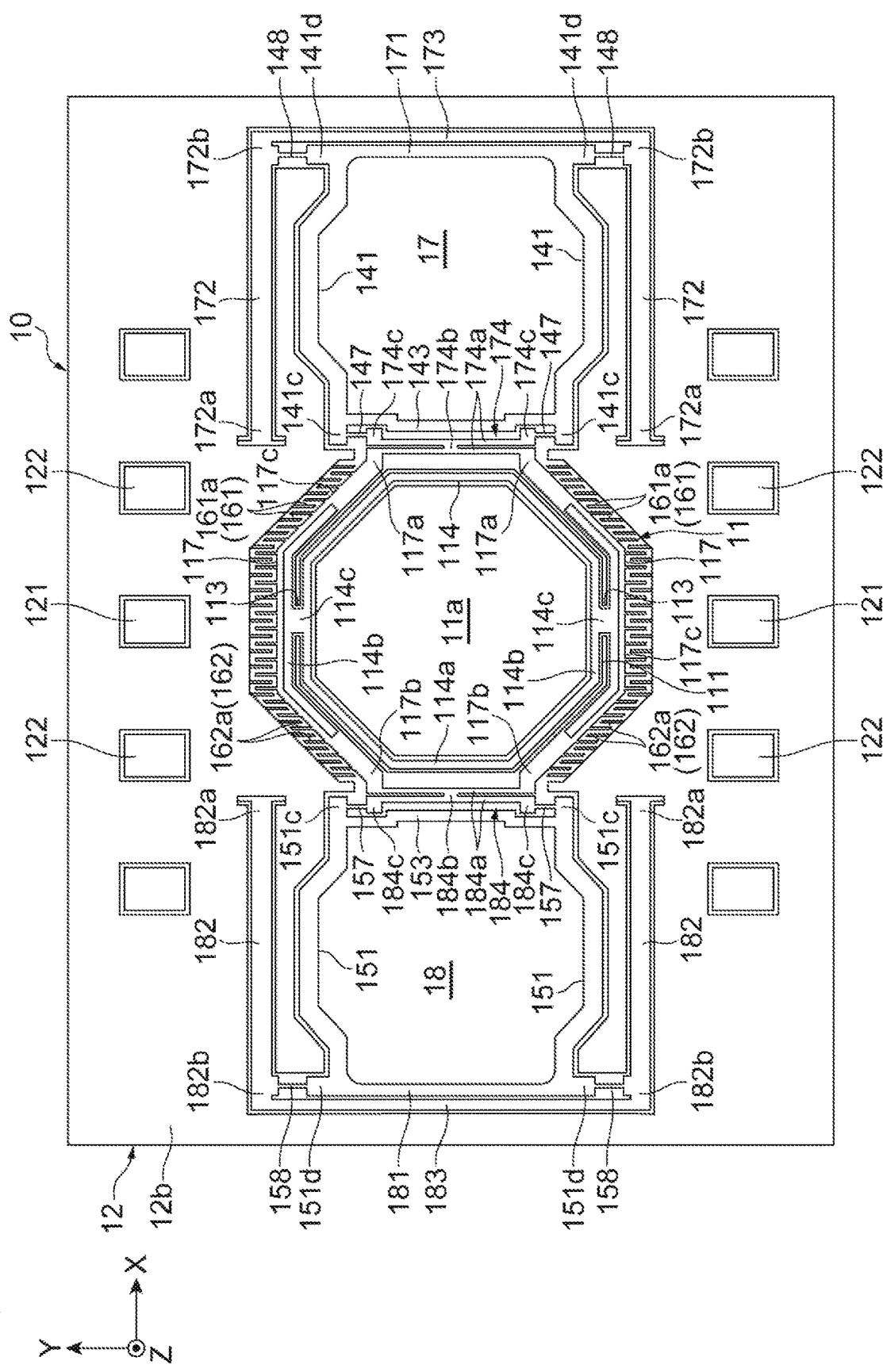

OPTICAL DEVICE

TECHNICAL FIELD

The present disclosure relates to an optical device configured as, for example, a micro electro mechanical systems (MEMS) device.

BACKGROUND ART

As an MEMS device, an optical device including a base; a movable portion which includes an optical function unit; an elastic support portion which is connected between the base and the movable portion and supports the movable portion so that the movable portion is movable along a movement direction; a first comb electrode which is provided in the base and includes a plurality of first comb fingers; and a second comb electrode which is provided in the elastic support portion and includes a plurality of second comb fingers alternately arranged with the plurality of first comb fingers is known (for example, see Patent Literature 1). In such an optical device, there is a case in which the elastic support portion includes a torsion bar which is twisted and deformed when the movable portion moves along the movement direction.

CITATION LIST

Non Patent Literature

Non Patent Literature 1: Thilo Sandner, Thomas Grasshoff, Harald Schenk, and Andreas Kenda, "Out-of-plane translator MEMS actuator with extraordinary large stroke for optical path length modulation in miniaturized FTIR Spectrometers", SENSOR+TEST Conferences 2011, Proceedings IRS2, pp. 151-156

SUMMARY OF INVENTION

Technical Problem

In the optical device as described above, the torsion bar is bent and deformed in a direction perpendicular to an extension direction when the movable portion moves in the movement direction depending on the configuration of the elastic support portion. In this case, nonlinearity occurs in the torsional deformation of the torsion bar because the torsion bar is twisted in a bent state. Because there is concern that such nonlinearity may deteriorate the control characteristic of the movable portion, the occurrence of nonlinearity needs to be suppressed. Further, in the optical device as described above, it is required to increase the movement amount of the movable portion in the movement direction, but nonlinearity easily occurs in torsional deformation of the torsion bar as the movement amount increases.

An object of an aspect of the present disclosure is to provide an optical device capable of suppressing the occurrence of nonlinearity in torsional deformation of a torsion bar while increasing the movement amount of a movable portion.

Solution to Problem

An optical device according to an aspect of the present disclosure includes: a base; a movable portion which includes an optical function unit; an elastic support portion which is connected between the base and the movable portion and supports the movable portion so that the movable portion is movable along a first direction; a first comb electrode which is provided to the base and includes a plurality of first comb fingers; and a second comb electrode which is provided to at least the movable portion and includes a plurality of second comb fingers alternately arranged with the plurality of first comb fingers, in which the elastic support portion includes a torsion bar extending along a second direction perpendicular to the first direction and a nonlinearity relaxation spring connected between the torsion bar and the movable portion, in which the nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a deformation amount of the torsion bar in the third direction while the movable portion moves in the first direction, and in which the second comb electrode is disposed along an outer edge of the movable portion.

In the optical device, the second comb electrode is disposed along the outer edge of the movable portion. Accordingly, it is possible to secure a distance from a connection position with respect to the base in the elastic support portion to a position in which an electrostatic force generated by the first and second comb electrodes is exerted and to secure an arrangement area of the second comb electrode. As a result, it is possible to highly efficiently use the electrostatic force generated by the first and second comb electrodes as the driving force of the movable portion and to increase the movement amount of the movable portion. Further, in the optical device, the elastic support portion includes the nonlinearity relaxation spring connected between the torsion bar and the movable portion. The nonlinearity relaxation spring is configured so that the deformation amount of the nonlinearity relaxation spring around the second direction is smaller than the deformation amount of the torsion bar around the second direction and the deformation amount of the nonlinearity relaxation spring in the third direction is larger than the deformation amount of the torsion bar in the third direction while the movable portion moves in the first direction. Accordingly, because the nonlinearity relaxation spring is deformed in the third direction so as to be larger than the torsion bar while being deformed around the second direction so as to be smaller than the torsion bar when the movable portion moves in the first direction, it is possible to suppress the torsion bar from being bent and deformed in the third direction. As a result, it is possible to suppress the occurrence of nonlinearity in torsional deformation of the torsion bar. Thus, according to the optical device, it is possible to suppress the occurrence of nonlinearity in torsional deformation of the torsion bar while increasing the movement amount of the movable portion.

In the optical device according to an aspect of the present disclosure, the first comb finger and the second comb finger which are adjacent to each other may face each other in the third direction. Accordingly, it is possible to efficiently dispose the second comb electrode and to appropriately secure the magnitude of the electrostatic force generated by the first and second comb electrodes.

In the optical device according to an aspect of the present disclosure, the nonlinearity relaxation spring may include a plate-shaped portion and the length of the plate-shaped portion in the second direction may be longer than the length of the torsion bar. Accordingly, it is possible to effectively suppress the occurrence of nonlinearity in torsional deformation of the torsion bar.

In the optical device according to an aspect of the present disclosure, the nonlinearity relaxation spring may include a pair of facing portions facing each other and a connection portion connecting the pair of facing portions to each other. Accordingly, it is possible to effectively suppress the occurrence of nonlinearity in torsional deformation of the torsion bar.

In the optical device according to an aspect of the present disclosure, the elastic support portion may further include a first lever connected to the nonlinearity relaxation spring through the torsion bar at one end portion and a torsion bar connected between the base and the other end portion of the first lever. Accordingly, it is possible to further increase the movement amount of the movable portion.

In the optical device according to an aspect of the present disclosure, the elastic support portion may further include a second lever connected to the base at one end portion and connected to the other end portion of the first lever through the torsion bar at the other end portion and the second lever may be provided with a removal portion. Accordingly, it is possible to further increase the movement amount of the movable portion.

In the optical device according to an aspect of the present disclosure, the elastic support portion may further include a second lever connected to the base at one end portion and connected to the other end portion of the first lever through the torsion bar at the other end portion and the first lever and the second lever may not be provided with a removal portion. Accordingly, because the removal portion is not provided, it is possible to improve the vibration impact resistance in the second direction and to reduce the influence on the operation due to the dimensional variation caused by the manufacturing.

Advantageous Effects of Invention

According to an aspect of the present disclosure, it is possible to provide an optical device capable of suppressing the occurrence of nonlinearity in torsional deformation of a torsion bar while securing the movement amount of a movable portion.

BRIEF DESCRIPTION OF DRAWINGS

FIGS. 6(a) and 6(b) are diagrams for describing an function and an effect of the optical device illustrated in FIG. 3.

FIGS. 7(a) and 7(b) are diagrams for describing an function and an effect of the optical device illustrated in FIG. 3.

FIG. 15 is a plan view of a second modified example of the optical device.

DESCRIPTION OF EMBODIMENTS

Figure 1:
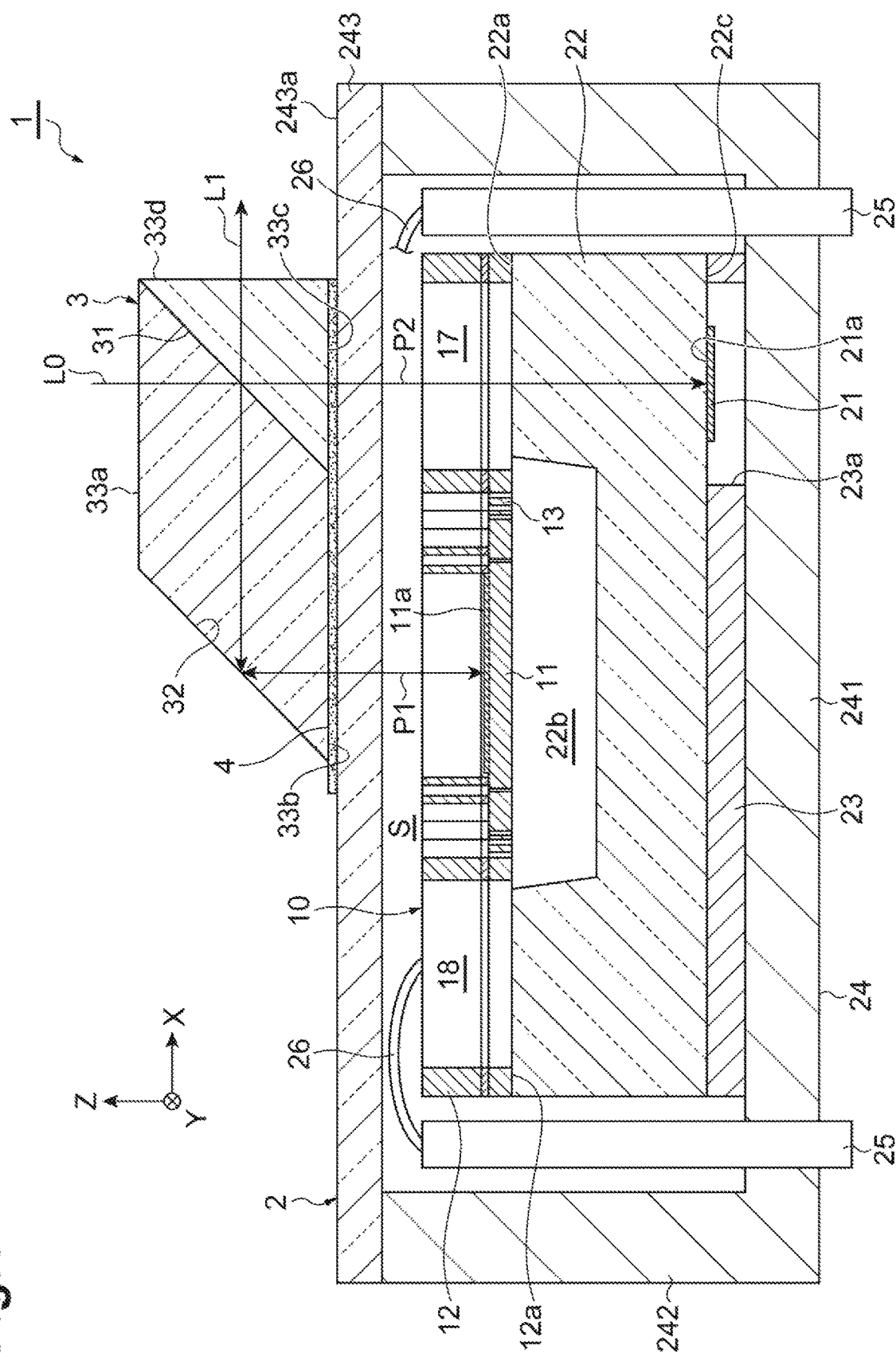
FIG. 1 is a longitudinal sectional view of an optical module with an optical device of an embodiment.

Hereinafter, an embodiment according to an aspect of the present disclosure will be described in detail with reference to the drawings. Furthermore, in the drawings, the same or corresponding components will be denoted by the same reference numerals and a redundant part will be omitted.

Configuration of Optical Module

As illustrated in FIG. 1, an optical module 1 includes a mirror unit 2 and a beam splitter unit 3. The mirror unit 2 includes an optical device 10 and a fixed mirror 21. The optical device 10 includes a movable mirror (a movable portion) 11. In the optical module 1, the beam splitter unit 3, the movable mirror 11, and the fixed mirror 21 constitute an interference optical system for measurement light L0. Here, the interference optical system is a Michelson interference optical system.

The optical device 10 includes a base 12, a drive unit 13, a first optical function unit 17, and a second optical function unit 18 in addition to the movable mirror 11. The base 12 includes a main surface 12a. The movable mirror 11 includes a mirror surface (an optical function unit) 11a following a plane parallel to the main surface 12a. The movable mirror 11 is supported by the base 12 so as to be movable along a Z-axis direction perpendicular to the main surface 12a (a direction parallel to the Z axis, a first direction). The drive unit 13 moves the movable mirror 11 along the Z-axis direction. The first optical function unit 17 is disposed at one side of the movable mirror 11 in an X-axis direction perpendicular to the Z-axis direction (a direction parallel to the X axis, a third direction) when viewed from the Z-axis direction. The second optical function unit 18 is disposed at the other side of the movable mirror 11 in the X-axis direction when viewed from the Z-axis direction. The first optical function unit 17 and the second optical function unit 18 are respectively light passage opening portions provided in the base 12 and are opened to one side and the other side in the Z-axis direction. Furthermore, in the optical module 1, the second optical function unit 18 is not used as the light passage opening portion. When the optical device 10 is applied to other apparatuses, there is a case in which at least one of the first optical function unit 17 and the second optical function unit 18 is used as the optical function unit or both of the first optical function unit 17 and the second optical function unit 18 are not used as the optical function unit.

The fixed mirror 21 includes a mirror surface 21a following a plane parallel to the main surface 12a (a plane perpendicular to the Z-axis direction). The position of the fixed mirror 21 with respect to the base 12 is fixed. In the mirror unit 2, the mirror surface 11a of the movable mirror 11 and the mirror surface 21a of the fixed mirror 21 face one side in the Z-axis direction (the side of the beam splitter unit 3).

The mirror unit 2 includes a support body 22, a sub-mount 23, and a package 24 in addition to the optical device 10 and the fixed mirror 21. The package 24 accommodates the optical device 10, the fixed mirror 21, the support body 22, and the sub-mount 23. The package 24 includes a bottom wall 241, a side wall 242, and a ceiling wall 243. The package 24 is formed in, for example, a rectangular parallelepiped box shape. The package 24 has, for example, a size of about 30×25×10 (thickness) mm. The bottom wall 241 and the side wall 242 are integrally formed with each other. The ceiling wall 243 faces the bottom wall 241 in the Z-axis direction and is fixed to the side wall 242. The ceiling wall 243 has optical transparency with respect to the measurement light L0. In the mirror unit 2, a space S is formed by the package 24. The space S is opened to the outside of the mirror unit 2 through, for example, a ventilation hole, a gap, or the like provided in the package 24. In this way, when the space S is not an airtight space, contamination, clouding, or the like of the mirror surface 11a caused by an out gas from the resin material present in the package 24, moisture present in the package 24, or the like can be suppressed. Additionally, the space S may be an airtight space in which a high degree of vacuum is maintained or an airtight space filled with an inert gas such as nitrogen.

The support body 22 is fixed to the inner surface of the bottom wall 241 through the sub-mount 23. The support body 22 is formed in, for example, a rectangular plate shape. The support body 22 has optical transparency with respect to the measurement light L0. The base 12 of the optical device 10 is fixed to a surface 22a at the side opposite to the sub-mount 23 in the support body 22. That is, the base 12 is supported by the support body 22. A concave portion 22b is formed on the surface 22a of the support body 22 and a gap (a part of the space S) is formed between the optical device 10 and the ceiling wall 243. Accordingly, the contact of the movable mirror 11 and the drive unit 13 with respect to the support body 22 and the ceiling wall 243 is prevented when the movable mirror 11 is moved along the Z-axis direction.

An opening 23a is formed in the sub-mount 23. The fixed mirror 21 is disposed on a surface 22c at the side of the sub-mount 23 in the support body 22 so as to be located within the opening 23a. That is, the fixed mirror 21 is disposed on the surface 22c at the side opposite to the base 12 in the support body 22. The fixed mirror 21 is disposed at one side of the movable mirror 11 in the X-axis direction when viewed from the Z-axis direction. The fixed mirror 21 overlaps the first optical function unit 17 of the optical device 10 when viewed from the Z-axis direction.

The mirror unit 2 further includes a plurality of lead pins 25 and a plurality of wires 26. Each lead pin 25 is fixed to the bottom wall 241 while penetrating the bottom wall 241. Each lead pin 25 is electrically connected to the drive unit 13 through a wire 26. In the mirror unit 2, an electric signal for moving the movable mirror 11 along the Z-axis direction is applied to the drive unit 13 through the plurality of lead pins 25 and the plurality of wires 26.

The beam splitter unit 3 is supported by the ceiling wall 243 of the package 24. Specifically, the beam splitter unit 3 is fixed to a surface 243a at the side opposite to the optical device 10 in the ceiling wall 243 by an optical resin 4. The optical resin 4 has optical transparency with respect to the measurement light L0.

The beam splitter unit 3 includes a half mirror surface 31, a total reflection mirror surface 32, and a plurality of optical surface 33a, 33b, 33c, and 33d. The beam splitter unit 3 is configured by bonding a plurality of optical blocks. The half mirror surface 31 is formed by, for example, a dielectric multilayer. The total reflection mirror surface 32 is formed by, for example, a metal film.

The optical surface 33a is, for example, a surface perpendicular to the Z-axis direction and overlaps the first optical function unit 17 of the optical device 10 and the mirror surface 21a of the fixed mirror 21 when viewed from the Z-axis direction. The measurement light L0 which is incident along the Z-axis direction is transmitted through the optical surface 33a.

The half mirror surface 31 is, for example, a surface inclined by 45° with respect to the optical surface 33a and overlaps the first optical function unit 17 of the optical device 10 and the mirror surface 21a of the fixed mirror 21 when viewed from the Z-axis direction. The half mirror surface 31 reflects a part of the measurement light L0, which is incident to the optical surface 33a along the Z-axis direction, along the X-axis direction and transmits the remaining part of the measurement light L0 toward the fixed mirror 21 along the Z-axis direction.

The total reflection mirror surface 32 is a surface parallel to the half mirror surface 31, overlaps the mirror surface 11a of the movable mirror 11 when viewed from the Z-axis direction, and overlaps the half mirror surface 31 when viewed from the X-axis direction. The total reflection mirror surface 32 reflects a part of the measurement light L0 reflected by the half mirror surface 31 toward the movable mirror 11 along the Z-axis direction.

The optical surface 33b is a surface parallel to the optical surface 33a and overlaps the mirror surface 11a of the movable mirror 11 when viewed from the Z-axis direction. The optical surface 33b transmits a part of the measurement light L0 reflected by the total reflection mirror surface 32 toward the movable mirror 11 along the Z-axis direction.

The optical surface 33c is a surface parallel to the optical surface 33a and overlaps the mirror surface 21a of the fixed mirror 21 when viewed from the Z-axis direction. The optical surface 33c transmits the remaining part of the measurement light L0 transmitted through the half mirror surface 31 toward the fixed mirror 21 along the Z-axis direction.

The optical surface 33d is, for example, a surface perpendicular to the X-axis direction and overlaps the half mirror surface 31 and the total reflection mirror surface 32 when viewed from the X-axis direction. The optical surface 33d transmits the measurement light L1 along the X-axis direction. The measurement light L1 is the interference light of a part of the measurement light L0 sequentially reflected by the mirror surface 11a of the movable mirror 11 and the total reflection mirror surface 32 and transmitted through the half mirror surface 31 and the remaining part of the measurement light L0 sequentially reflected by the mirror surface 21a of the fixed mirror 21 and the half mirror surface 31.

In the optical module 1 with the above-described configuration, when the measurement light L0 is incident from the outside of the optical module 1 to the beam splitter unit 3 through the optical surface 33a, a part of the measurement light L0 is sequentially reflected by the half mirror surface 31 and the total reflection mirror surface 32 and travels toward the mirror surface 11a of the movable mirror 11. Then, a part of the measurement light L0 is reflected by the mirror surface 11a of the movable mirror 11, travels in the reverse direction on the same optical path (an optical path P1 to be described later), and is transmitted through the half mirror surface 31 of the beam splitter unit 3.

Meanwhile, the remaining part of the measurement light L0 is transmitted through the half mirror surface 31 of the beam splitter unit 3, passes through the first optical function unit 17, is further transmitted through the support body 22, and travels toward the mirror surface 21a of the fixed mirror 21. Then, the remaining part of the measurement light L0 is reflected by the mirror surface 21a of the fixed mirror 21, travels in the reverse direction on the same optical path (an optical path P2 to be described later), and is reflected by the half mirror surface 31 of the beam splitter unit 3.

A part of the measurement light L0 transmitted through the half mirror surface 31 of the beam splitter unit 3 and the remaining part of the measurement light L0 reflected by the half mirror surface 31 of the beam splitter unit 3 become the measurement light L1 that is the interference light and the measurement light L1 is emitted from the beam splitter unit 3 to the outside of the optical module 1 through the optical surface 33d. According to the optical module 1, because it is possible to reciprocate the movable mirror 11 at a high speed along the Z-axis direction, a small and highly accurate Fourier transform infrared spectrometer (FTIR) can be provided.

The support body 22 corrects an optical path difference between an optical path P1 between the beam splitter unit 3 and the movable mirror 11 and an optical path P2 between the beam splitter unit 3 and the fixed mirror 21. Specifically, the optical path P1 is an optical path extending from the half mirror surface 31 to the mirror surface 11a of the movable mirror 11 located at the reference position through the total reflection mirror surface 32 and the optical surface 33b in a sequential order and is an optical path along which a part of the measurement light L0 travels. The optical path P2 is an optical path extending from the half mirror surface 31 to the mirror surface 21a of the fixed mirror 21 through the optical surface 33c and the first optical function unit 17 in a sequential order and is an optical path along which the remaining part of the measurement light L0 travels. The support body 22 corrects the optical path difference between the optical path P1 and the optical path P2 so that a difference between the optical path length of the optical path P1 (the optical path length considering the refractive index of each medium through which the optical path P1 passes) and the optical path length of the optical path P2 (the optical path length considering the refractive index of each medium through which the optical path P2 passes) decreases (for example, becomes zero). Furthermore, the support body 22 can be formed of, for example, a material having the same optical transparency as that of each of the optical blocks constituting the beam splitter unit 3. In this case, the thickness (the length in the Z-axis direction) of the support body 22 can be the same as the distance between the half mirror surface 31 and the total reflection mirror surface 32 in the X-axis direction.

Configuration of Optical Device

Figure 2:
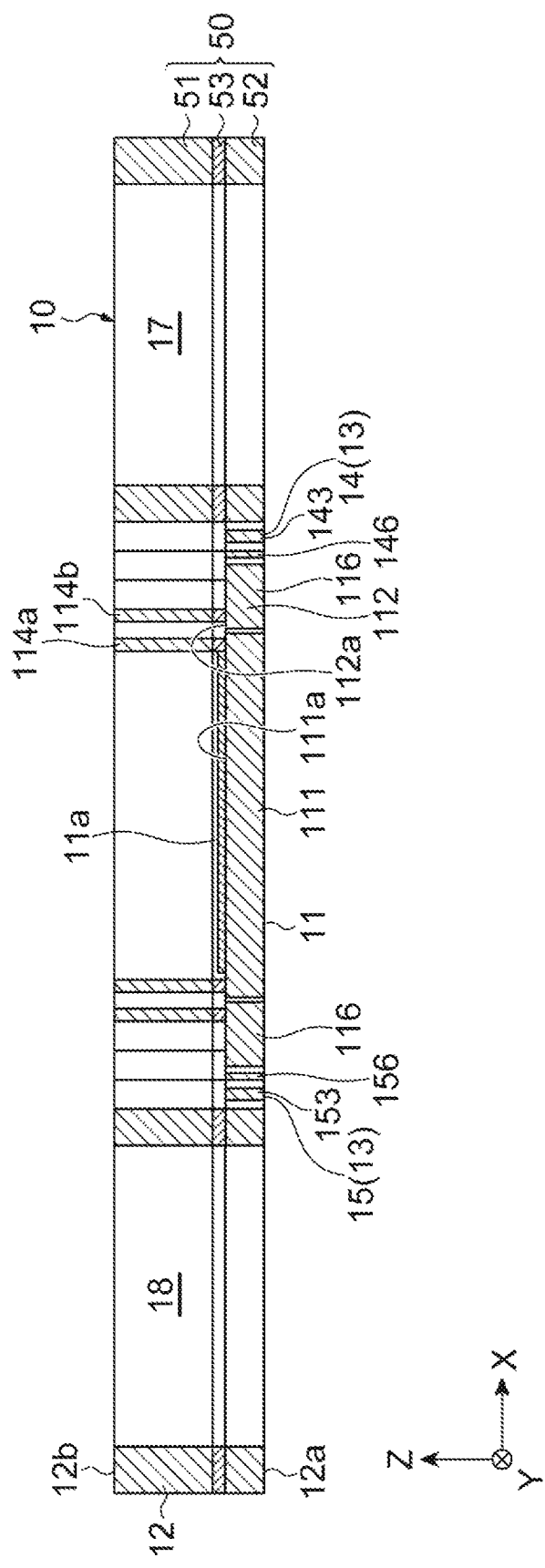
FIG. 2 is a longitudinal sectional view of the optical device illustrated in FIG. 1.
Figure 3:
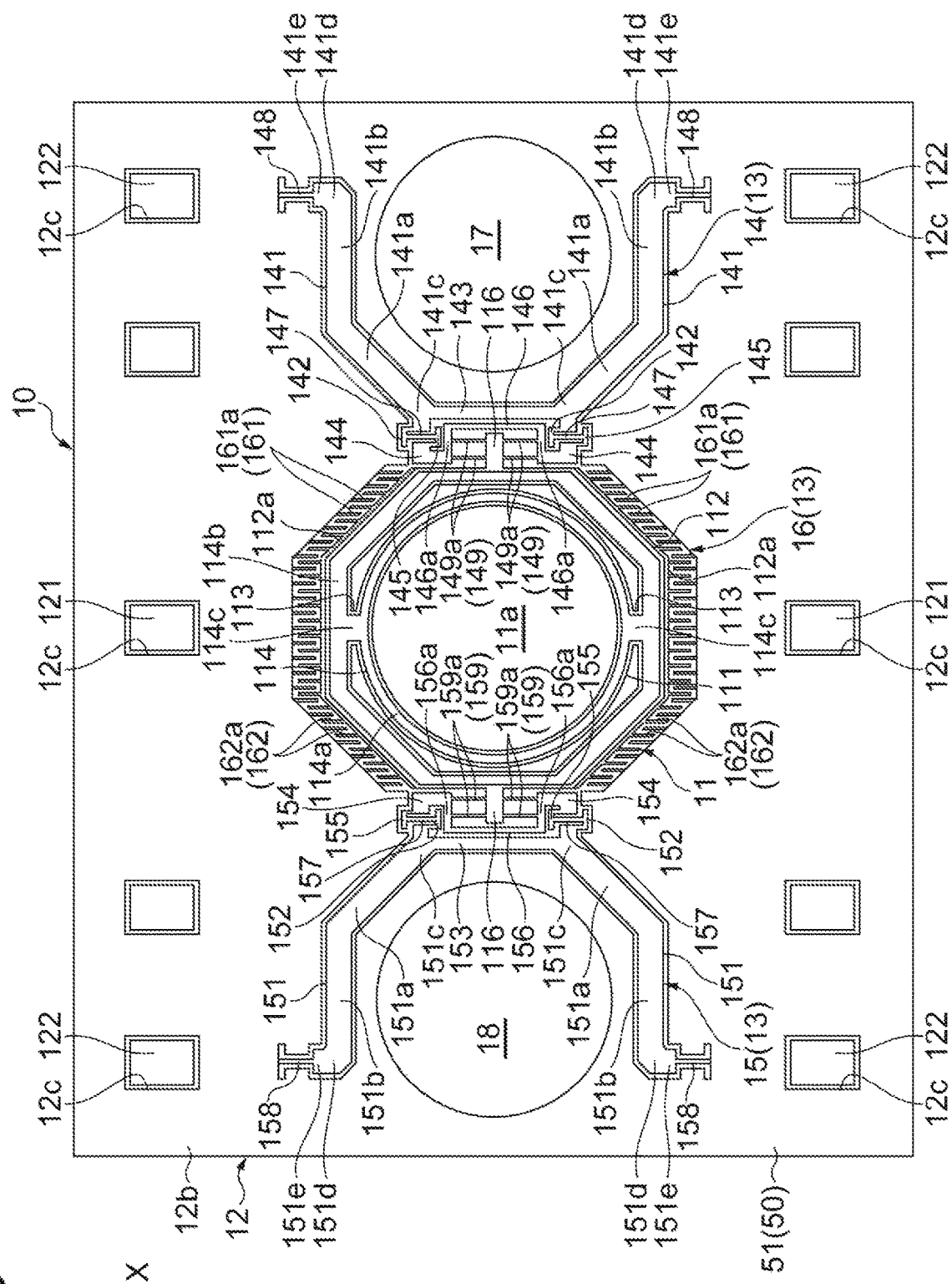
FIG. 3 is a plan view of the optical device illustrated in FIG. 2.

As illustrated in FIGS. 2 and 3, a portion other than the mirror surface 11a of the movable mirror 11, the base 12, the drive unit 13, the first optical function unit 17, and the second optical function unit 18 are configured by a silicon on insulator (SOI) substrate 50. That is, the optical device 10 is formed by the SOI substrate 50. The optical device 10 is formed in, for example, a rectangular plate shape. The optical device 10 has, for example, a size of about 15×10× 0.3 (thickness) mm. The SOI substrate 50 includes a support layer 51, a device layer 52, and an intermediate layer 53. Specifically, the support layer 51 is a first silicon layer of the SOI substrate 50. The device layer 52 is a second silicon layer of the SOI substrate 50. The intermediate layer 53 is an insulation layer of the SOI substrate 50 and is disposed between the support layer 51 and the device layer 52. The movable mirror 11 and the drive unit 13 are integrally formed in a part of the device layer 52 by an MEMS technology (patterning and etching).

The base 12 is formed by the support layer 51, the device layer 52, and the intermediate layer 53. The main surface 12a of the base 12 is a surface at the side opposite to the intermediate layer 53 in the device layer 52. A main surface 12b facing the main surface 12a in the base 12 is a surface at the side opposite to the intermediate layer 53 in the support layer 51. In the optical module 1, the main surface 12a of the base 12 is bonded to the surface 22a of the support body 22 (see FIG. 1).

The movable mirror 11 includes a main body 111, an annular portion 112, a pair of connection portions 113, and a wall portion 114. The main body 111, the annular portion 112, and the pair of connection portions 113 are formed by the device layer 52. The main body 111 has a circular shape when viewed from the Z-axis direction, but may have any shape such as an octagonal shape. A metal film is formed on a surface 111a at the side of the main surface 12b in the main body 111 so that the mirror surface 11a is provided. The annular portion 112 extends along the outer edge of the main body 111 and is formed in an annular shape so as to surround the main body 111 when viewed from the Z-axis direction. The inner edge and the outer edge of the annular portion 112 are formed in an octagonal shape when viewed from the Z-axis direction, but may be formed in any shape such as a circular shape. The pair of connection portions 113 are respectively disposed at one side and the other side of the Y-axis direction perpendicular to the Z-axis direction and the X-axis direction (a direction parallel to the Y axis, a second direction) with respect to the main body 111. Each connection portion 113 connects the main body 111 and the annular portion 112 to each other.

The wall portion 114 is formed by the support layer 51 and the intermediate layer 53. The wall portion 114 includes an inner wall portion 114a, an outer wall portion 114b, and a pair of connection portions 114c. The inner wall portion 114a is provided in the surface 111a of the main body 111. The inner wall portion 114a surrounds the mirror surface 11a when viewed from the Z-axis direction. As an example, the inner wall portion 114a is provided in the surface 111a of the main body 111 so as to follow the outer edge at the inside of the outer edge of the main body 111 when viewed from the Z-axis direction and to follow the outer edge at the outside of the outer edge of the mirror surface 11a when viewed from the Z-axis direction.

The outer wall portion 114b is provided in a surface 112a at the side of the main surface 12b in the annular portion 112. As an example, the outer wall portion 114b is provided in the surface 112a of the annular portion 112 so as to follow the outer edge at the inside of the outer edge of the annular portion 112 when viewed from the Z-axis direction and to follow the inner edge at the outside of the inner edge of the annular portion 112 when viewed from the Z-axis direction. The pair of connection portions 114c are respectively provided in a surface at the side of the main surface 12b in the pair of connection portions 113. Each connection portion 114c connects the inner wall portion 114a and the outer wall portion 114b to each other.

The movable mirror 11 further includes a pair of brackets 116. Each bracket 116 is formed by the device layer 52. Each bracket 116 has a rectangular shape when viewed from the Z-axis direction. One bracket 116 is provided in a surface at the side of the first optical function unit 17 in the annular portion 112 so as to protrude toward the first optical function unit 17. The other bracket 116 is provided in a surface at the side of the second optical function unit 18 in the annular portion 112 so as to protrude toward the second optical function unit 18 (the side opposite to the first optical function unit 17).

The drive unit 13 includes a first elastic support portion 14, a second elastic support portion 15, and an actuator 16. The first elastic support portion 14, the second elastic support portion 15, and the actuator 16 are formed by the device layer 52.

Each of the first elastic support portion 14 and the second elastic support portion 15 is connected between the base 12 and the movable mirror 11. The first elastic support portion 14 and the second elastic support portion 15 support the movable mirror 11 so that the movable mirror 11 is movable along the Z-axis direction.

The first elastic support portion 14 includes a pair of first levers 141, a pair of brackets 142, a link 143, a pair of intermediate members 144, a pair of brackets 145, a link 146, a pair of first torsion bars 147, a pair of second torsion bars 148, and a pair of nonlinearity relaxation springs 149. The pair of first levers 141 extend along a plane perpendicular to the Z-axis direction from the side of the movable mirror 11 toward both sides of the first optical function unit 17 in the Y-axis direction. In this embodiment, the pair of first levers 141 extend along the main surface 12a of the base 12 from a gap between the movable mirror 11 and the first optical function unit 17 toward both sides of the first optical function unit 17 in the Y-axis direction.

Each first lever 141 includes a first portion 141a which is disposed at the side of the movable mirror 11 and a second portion 141b which is disposed at the side opposite to the movable mirror 11 with respect to the first portion 141a. In the pair of first levers 141, the first portions 141a obliquely extend so as to be separated from each other as it goes away from the movable mirror 11. Each second portion 141b extends along the X-axis direction.

The pair of brackets 142 are provided in the surface at the side of the movable mirror 11 in the first portion 141a so as to protrude toward the movable mirror 11. Each bracket 142 is bent in a crank shape to the same side when viewed from the Z-axis direction. The link 143 is laid between end portions 141c at the side of the movable mirror 11 in the first levers 141. The link 143 extends along the Y-axis direction.

Each intermediate member 144 has a rectangular shape when viewed from the Z-axis direction. One intermediate member 144 is disposed between the movable mirror 11 and the end portion 141c of one first lever 141. The other intermediate member 144 is disposed between the movable mirror 11 and the end portion 141c of the other first lever 141.

The pair of brackets 145 are provided in the surface at the side of the first optical function unit 17 in the intermediate member 144 so as to protrude toward the first optical function unit 17. Each bracket 145 is bent in a crank shape to the same side (here, the side opposite to each bracket 142) when viewed from the Z-axis direction. The front end portion of one bracket 145 faces the front end portion of one bracket 142 in the Y-axis direction. The front end portion of the other bracket 145 faces the front end portion of the other bracket 142 in the Y-axis direction.

The link 146 is laid between the inner end portions of the intermediate members 144. The link 146 is formed in a substantially U-shape which is opened toward the movable mirror 11 when viewed from the Z-axis direction. The link 146 faces one bracket 116 of the movable mirror 11 in the Y-axis direction. More specifically, the link 146 includes a pair of side portions 146a extending in the X-axis direction and facing each other in the Y-axis direction and one bracket 116 is disposed between the pair of side portions 146a.

The first torsion bar 147 is laid between the front end portion of one bracket 142 and the front end portion of one bracket 145 and between the front end portion of the other bracket 142 and the front end portion of the other bracket 145. The first torsion bar 147 is laid between the bracket 142 and the bracket 145 which are bent in a crank shape to the opposite side. That is, the end portion 141c of each first lever 141 is connected to the intermediate member 144 through the first torsion bar 147. The pair of first torsion bars 147 are disposed on the same axis parallel to the Y-axis direction.

The second torsion bars 148 are respectively laid between the base 12 and the end portion 141d at the side opposite to the movable mirror 11 in one first lever 141 and between the base 12 and the end portion 141d at the side opposite to the movable mirror 11 in the other first lever 141. That is, the end portion 141d of each first lever 141 is connected to the base 12 through the second torsion bar 148. The pair of second torsion bars 148 are disposed on the same axis parallel to the Y-axis direction. The end portion 141d of each first lever 141 is provided with a protrusion portion 141e protruding outward in the Y-axis direction and the second torsion bar 148 is connected to the protrusion portion 141e.

The pair of nonlinearity relaxation springs 149 are respectively disposed at one side and the other side of the Y-axis direction with respect to one bracket 116 of the movable mirror 11. Each nonlinearity relaxation spring 149 is connected to the movable mirror 11 through one bracket 116 and is connected to the first torsion bar 147 through the link 146, the intermediate member 144, and the bracket 145. That is, each nonlinearity relaxation spring 149 is connected between the movable mirror 11 and the first torsion bar 147. Each nonlinearity relaxation spring 149 includes a pair of plate-shaped portions 149a laid between one bracket 116 and the pair of side portions 146a of the link 146.

Each plate-shaped portion 149a has a flat plate shape which is perpendicular to the X-axis direction. In one nonlinearity relaxation spring 149, the pair of plate-shaped portions 149a face each other in the X-axis direction. In the pair of nonlinearity relaxation springs 149, the plate-shaped portion 149a located at one side in the X-axis direction is disposed along one plane perpendicular to the X-axis direction and the plate-shaped portion 149a located at the other side in the X-axis direction is disposed along another plane perpendicular to the X-axis direction.

Each plate-shaped portion 149a is formed to have, for example, a length (a length in the Y-axis direction) of about 380 μm, a width (a length in the X-axis direction) of about 5 to 10 μm, and a thickness (a length in the Z-axis direction) of about 70 μm. The length of each plate-shaped portion 149a is longer than each of the length of the first torsion bar 147 and the length of the second torsion bar 148. The width of each plate-shaped portion 149a is narrower than each of the width of the first torsion bar 147 and the width of the second torsion bar 148. Furthermore, when at least one of the end portion at the side of the bracket 116 and the end portion at the side of the side portion 146a in the plate-shaped portion 149a is provided with a wide portion which is wider as it goes away from the end portion, the length of the plate-shaped portion 149a means the length of the plate-shaped portion 149a without the wide portion. The same applies to each of the first torsion bar 147 and the second torsion bar 148 and to each of a first torsion bar 157, a second torsion bar 158, and a plate-shaped portion 159a which will be described later.

The second elastic support portion 15 includes a pair of first levers 151, a pair of brackets 152, a link 153, a pair of intermediate members 154, a pair of brackets 155, a link 156, a pair of first torsion bars 157, a pair of second torsion bars 158, and a pair of nonlinearity relaxation springs 159. The pair of first levers 151 extend along a plane perpendicular to the Z-axis direction from the side of the movable mirror 11 toward both sides of the second optical function unit 18 in the Y-axis direction. In this embodiment, the pair of first levers 151 extend along the main surface 12a of the base 12 from a gap between the movable mirror 11 and the second optical function unit 18 toward both sides of the second optical function unit 18 in the Y-axis direction.

Each first lever 151 includes a first portion 151a which is disposed at the side of the movable mirror 11 and a second portion 151b which is disposed at the side opposite to the movable mirror 11 with respect to the first portion 151a. In the pair of first levers 151, the first portions 151a obliquely extend so as to be separated from each other as it goes away from the movable mirror 11. Each second portion 151b extends along the X-axis direction.

The pair of brackets 152 are provided in a surface at the side of the movable mirror 11 in the first portion 151a so as to protrude toward the movable mirror 11. Each bracket 152 is bent in a crank shape to the same side (here, the side opposite to each bracket 142) when viewed from the Z-axis direction. The link 153 is laid between end portions 151c at the side of the movable mirror 11 in the first levers 151. The link 153 extends along the Y-axis direction.

Each intermediate member 154 has a rectangular shape when viewed from the Z-axis direction. One intermediate member 154 is disposed between the movable mirror 11 and the end portion 151c of one first lever 151. The other intermediate member 154 is disposed between the movable mirror 11 and the end portion 151c of the other first lever 151.

The pair of brackets 155 are provided in the surface at the side of the second optical function unit 18 in the intermediate member 154 so as to protrude toward the second optical function unit 18. Each bracket 155 is bent in a crank shape to the same side (here, the side opposite to each bracket 152) when viewed from the Z-axis direction. The front end portion of one bracket 155 faces the front end portion of one bracket 152 in the Y-axis direction. The front end portion of the other bracket 155 faces the front end portion of the other bracket 152 in the Y-axis direction.

The link 156 is laid between the inner end portions of the intermediate members 154. The link 156 is formed in a substantially U-shape which is opened toward the movable mirror 11 when viewed from the Z-axis direction. The link 156 faces the other bracket 116 of the movable mirror 11 in the Y-axis direction. More specifically, the link 156 includes a pair of side portions 156a extending in the X-axis direction and facing each other in the Y-axis direction and the other bracket 116 is disposed between the pair of side portions 156a.

The first torsion bar 157 is laid between the front end portion of one bracket 152 and the front end portion of one bracket 155 and between the front end portion of the other bracket 152 and the front end portion of the other bracket 155. The first torsion bar 157 is laid between the bracket 152 and the bracket 155 bent in a crank shape to the opposite side. That is, the end portion 151c of each first lever 151 is connected to the intermediate member 154 through the first torsion bar 157. The pair of first torsion bars 157 are disposed on the same axis parallel to the Y-axis direction.

The second torsion bars 158 are respectively laid between the base 12 and the end portion 151d at the side opposite to the movable mirror 11 in one first lever 151 and between the base 12 and the end portion 151d at the side opposite to the movable mirror 11 in the other first lever 151. That is, the end portion 151d of each first lever 151 is connected to the base 12 through the second torsion bar 158. The pair of second torsion bars 158 are disposed on the same axis parallel to the Y-axis direction. The end portion 151d of each first lever 151 is provided with a protrusion portion 151e protruding outward in the Y-axis direction and the second torsion bar 158 is connected to the protrusion portion 151e.

The pair of nonlinearity relaxation springs 159 are respectively disposed at one side and the other side of the Y-axis direction with respect to the other bracket 116 of the movable mirror 11. Each nonlinearity relaxation spring 159 is connected to the movable mirror 11 through the other bracket 116 and is connected to the first torsion bar 157 through the link 156, the intermediate member 154, and the bracket 155. That is, each nonlinearity relaxation spring 159 is connected between the movable mirror 11 and the first torsion bar 157. Each nonlinearity relaxation spring 159 includes a pair of plate-shaped portions 159a laid between the other bracket 116 and the pair of side portions 156a of the link 156.

Each plate-shaped portion 159a has a flat plate shape which is perpendicular to the X-axis direction. In one nonlinearity relaxation spring 159, the pair of plate-shaped portions 159a face each other in the X-axis direction. In the pair of nonlinearity relaxation springs 159, the plate-shaped portion 159a located at one side in the X-axis direction is disposed along one plane perpendicular to the X-axis direction and the plate-shaped portion 159a located at the other side in the X-axis direction is disposed along another plane perpendicular to the X-axis direction.

Each plate-shaped portion 159a is formed in, for example, the same shape as that of the plate-shaped portion 149a. The length of each plate-shaped portion 159a is longer than each of the length of the first torsion bar 157 and the length of the second torsion bar 158. The width of each plate-shaped portion 159a is narrower than the width of the first torsion bar 157 and the width of the second torsion bar 158.

Each of the first optical function unit 17 and the second optical function unit 18 is a light passage opening portion formed in the SOI substrate 50. Each of the first optical function unit 17 and the second optical function unit 18 has a circular cross-sectional shape when viewed from the Z-axis direction, but may be formed in any shape such as an octagonal cross-sectional shape. The first optical function unit 17 and the second optical function unit 18 may be void and may be formed of a material having optical transparency with respect to the measurement light L0.

The first elastic support portion 14 and the second elastic support portion 15 do not have a symmetrical structure with respect to a plane passing through the center of the movable mirror 11 and perpendicular to the X-axis direction and a plane passing through the center of the movable mirror 11 and perpendicular to the Y-axis direction. Here, a portion excluding the pair of brackets 142 and the pair of brackets 145 in the first elastic support portion 14 and a portion excluding the pair of brackets 152 and the pair of brackets 155 in the second elastic support portion 15 have a symmetrical structure with respect to a plane passing through the center of the movable mirror 11 and perpendicular to the X-axis direction and a plane passing through the center of the movable mirror 11 and perpendicular to the Y-axis direction.

The actuator 16 moves the movable mirror 11 along the Z-axis direction. The actuator 16 includes a pair of first comb electrodes 161 and a pair of second comb electrodes 162. The first comb electrode 161 is a fixed comb electrode of which a position is fixed and the second comb electrode 162 is a movable comb electrode which moves as the movable mirror 11 moves.

The pair of first comb electrodes 161 are disposed along the outer edge of the movable mirror 11. The pair of first comb electrodes 161 are respectively provided in the surfaces facing the outer surfaces 112a and 112a of the annular portion 112 in the Y-axis direction in the device layer 52 of the base 12. Each first comb electrode 161 includes a plurality of first comb fingers 161a extending along a plane perpendicular to the X-axis direction. The first comb fingers 161a are arranged side by side with a predetermined interval in the X-axis direction.

The pair of second comb electrodes 162 are disposed along the outer edge of the movable mirror 11. The pair of second comb electrodes 162 are respectively provided in the surfaces 112a and 112a of the annular portion 112. In this example, each second comb electrode 162 is disposed across the entire surface 111a of the annular portion 112 when viewed from the Z-axis direction. Each second comb electrode 162 includes a plurality of second comb fingers 162a extending along a plane perpendicular to the X-axis direction. The second comb fingers 162a are arranged side by side with a predetermined interval in the X-axis direction.

In one first comb electrode 161 and one second comb electrode 162, the plurality of first comb finger 161a and the plurality of second comb finger 162a are alternately arranged. That is, each first comb finger 161a of one first comb electrode 161 is located between the respective second comb fingers 162a of one second comb electrode 162. In the other first comb electrode 161 and the other second comb electrode 162, the plurality of first comb fingers 161a and the plurality of second comb fingers 162a are alternately arranged. That is, each first comb finger 161a of the other first comb electrode 161 is located between the respective second comb fingers 162a of the other second comb electrode 162. In the pair of first comb electrodes 161 and the pair of second comb electrodes 162, the first comb finger 161a and the second comb finger 162a which are adjacent to each other face each other in the X-axis direction. A distance between the first comb finger 161a and the second comb finger 162a which are adjacent to each other is, for example, about several μm.

The base 12 is provided with a plurality of electrode pads 121 and 122. Each of the electrode pads 121 and 122 is formed on the surface of the device layer 52 inside an opening 12c formed in the main surface 12b of the base 12 so as to reach the device layer 52. Each electrode pad 121 is electrically connected to the first comb electrode 161 through the device layer 52. Each electrode pad 122 is electrically connected to the second comb electrode 162 through the first elastic support portion 14 and the main body 111 of the movable mirror 11 or through the second elastic support portion 15 and the main body 111 of the movable mirror 11. The wire 26 is laid between each of the electrode pads 121 and 122 and each lead pin 25.

In the optical device 10 with the above-described configuration, when a voltage is applied across the plurality of electrode pads 121 and the plurality of electrode pads 122 through the plurality of lead pins 25 and the plurality of wires 26, for example, an electrostatic force is generated between the first comb electrode 161 and the second comb electrode 162 facing each other so that the movable mirror 11 is moved to one side in the Z-axis direction. At this time, in the first elastic support portion 14 and the second elastic support portion 15, the torsion bars 147, 148, 157, and 158 are twisted so that an elastic force is generated in the first elastic support portion 14 and the second elastic support portion 15. In the optical device 10, when a periodic electric signal is applied to the drive unit 13 through the plurality of lead pins 25 and the plurality of wires 26, the movable mirror 11 can be reciprocated along the Z-axis direction at the resonant frequency level. In this way, the drive unit 13 functions as an electrostatic actuator.

Figure 4:
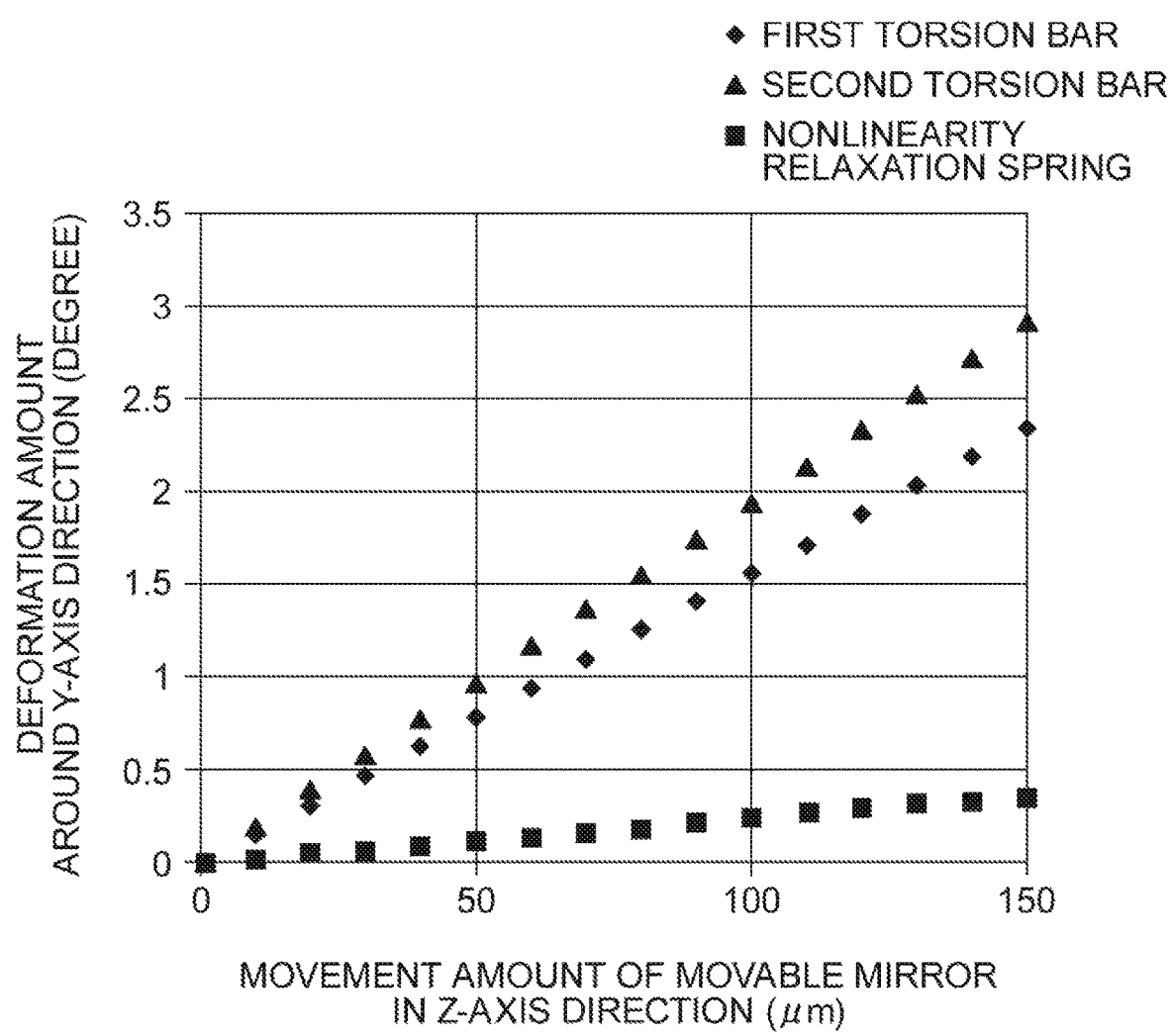
FIG. 4 is a graph showing a change in deformation amount of a torsion bar and a nonlinearity relaxation spring around a Y-axis direction with respect to a movement amount of a movable mirror.
Figure 5:
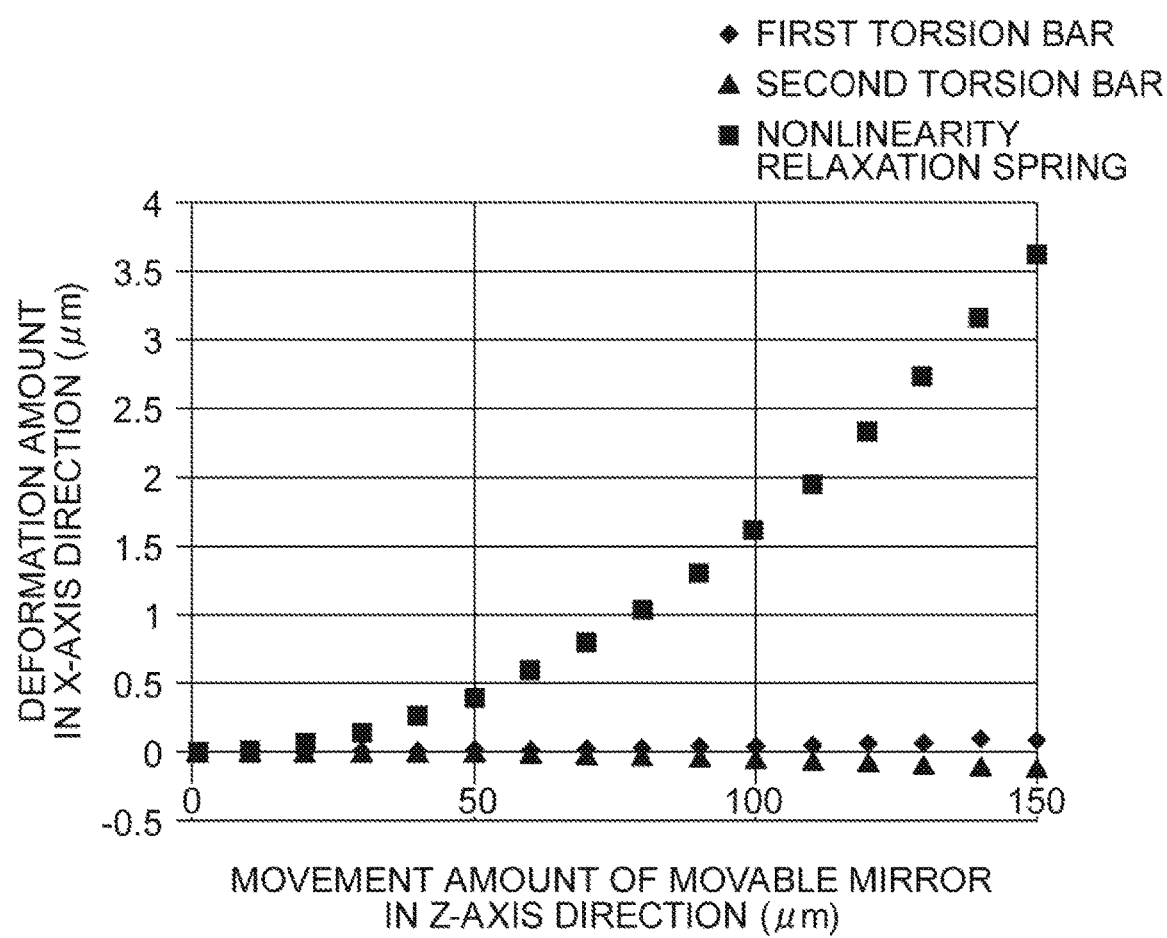
FIG. 5 is a graph showing a change in deformation amount of a torsion bar and a nonlinearity relaxation spring in an X-axis direction with respect to the movement amount of the movable mirror.

FIG. 4 is a graph showing a change in the deformation amount of the first torsion bar 147, the second torsion bar 148, and the nonlinearity relaxation spring 149 around the Y-axis direction with respect to the movement amount of the movable mirror 11 in the Z-axis direction. FIG. 5 is a graph showing a change in the deformation amount of the first torsion bar 147, the second torsion bar 148, and the nonlinearity relaxation spring 149 in the X-axis direction with respect to the movement amount of the movable mirror 11 in the Z-axis direction. Furthermore, the deformation amount of the first torsion bar 147, the second torsion bar 148, and the nonlinearity relaxation spring 149 around the Y-axis direction means, for example, an absolute value of a twist amount (twist angle). The deformation amount of the first torsion bar 147, the second torsion bar 148, and the nonlinearity relaxation spring 149 in the X-axis direction means, for example, an absolute value of bending. The deformation amount of the nonlinearity relaxation spring 149 around the Y-axis direction means, for example, the deformation amount of one plate-shaped portion 149a constituting the nonlinearity relaxation spring 149 around the Y-axis direction. The deformation amount of the nonlinearity relaxation spring 149 in the X-axis direction means, for example, the deformation amount of one plate-shaped portion 149a constituting the nonlinearity relaxation spring 149 in the X-axis direction. The deformation amount of a certain member around the Y-axis direction means the deformation amount of the member in the circumferential direction of the circle about the axis parallel to the Y axis and passing through the center of the member.

As shown in FIG. 4, when the movable mirror 11 moves in the Z-axis direction, each of the first torsion bar 147, the second torsion bar 148, and the nonlinearity relaxation spring 149 is deformed in the same direction around the Y-axis direction. When the movement amount of the movable mirror 11 increases, the deformation amount of each of the first torsion bar 147, the second torsion bar 148, and the nonlinearity relaxation spring 149 around the Y-axis direction linearly increases. Comparing the deformation amount of respective members around the Y-axis direction, when the movement amount of the movable mirror 11 is the same, the deformation amount of the first torsion bar 147 is smaller than the deformation amount of the second torsion bar 148 and the deformation amount of the nonlinearity relaxation spring 149 is much smaller than each of the deformation amount of the first torsion bar 147 and the deformation amount of the second torsion bar 148.

As shown in FIG. 5, when the movable mirror 11 moves in the Z-axis direction, the nonlinearity relaxation spring 149 is largely deformed in the X-axis direction and the first torsion bar 147 and the second torsion bar 148 are not substantially deformed in the X-axis direction. The deformation direction of the first torsion bar 147 is the same as the deformation direction of the nonlinearity relaxation spring 149 and is opposite to the deformation direction of the second torsion bar 148. When the movement amount of the movable mirror 11 increases, the deformation amount of the nonlinearity relaxation spring 149 in the X-axis direction increases quadratically. Comparing the deformation amount in the X-axis direction of respective members, when the movement amount of the movable mirror 11 is the same, the deformation amount of the first torsion bar 147 is substantially the same as the deformation amount of the second torsion bar 148 and the deformation amount of the nonlinearity relaxation spring 149 is much larger than each of the deformation amount of the first torsion bar 147 and the deformation amount of the second torsion bar 148.

In this way, the nonlinearity relaxation spring 149 is configured so that the deformation amount of the nonlinearity relaxation spring 149 around the Y-axis direction is smaller than the deformation amount of each of the torsion bars 147 and 148 around the Y-axis direction and the deformation amount of the nonlinearity relaxation spring 149 in the X-axis direction is larger than the deformation amount of each of the torsion bars 147 and 148 in the X-axis direction while the movable mirror 11 moves in the Z-axis direction. Similarly, the nonlinearity relaxation spring 159 is configured so that the deformation amount of the nonlinearity relaxation spring 159 around the Y-axis direction is smaller than the deformation amount of each of the torsion bars 157 and 158 around the Y-axis direction and the deformation amount of the nonlinearity relaxation spring 159 in the X-axis direction is larger than the deformation amount of each of the torsion bars 157 and 158 in the X-axis direction while the movable mirror 11 moves in the Z-axis direction. Furthermore, a relationship between the deformation amount around the Y-axis direction and the deformation amount in the X-axis direction of these members may be satisfied within a predetermined movable range of the movable mirror 11.

Next, function and effects of the optical device 10 will be described with reference to FIGS. 6 and 7. FIGS. 6 and 7 illustrate that a part of the configuration of the optical device 10 when viewed from the Y-axis direction is simplified. FIG. 6 is a diagram illustrating a comparative example and FIG. 7 is a diagram illustrating the optical device 10 of the above-described embodiment. The comparative example corresponds to an example in which the nonlinearity relaxation springs 149 and 159 are not provided in the optical device 10 of the above-described embodiment and each bracket 116 is connected to the intermediate members 144 and 154 by a rigid member. A movable mirror 1011, first levers 1141 and 1151, first torsion bars 1147 and 1157, and second torsion bars 1148 and 1158 of the comparative example respectively correspond to the movable mirror 11, the first levers 141 and 151, the first torsion bars 147 and 157, and the second torsion bars 148 and 158 of the optical device 10 of the above-described embodiment.

Hereinafter, the side of the first torsion bar 1157 is exemplified, but the same applies to the side of the first torsion bar 1147. As illustrated in FIG. 6, assuming that the first torsion bar 1157 moves only by the torsional deformation of the second torsion bar 1158 when the movable mirror 1011 of the comparative example moves in the Z-axis direction, the first torsion bar 1157 moves to the position B and moves away from the movable mirror 1011 by the distance L between the position A and the position B. For that reason, the first torsion bar 1157 and the second torsion bar 1158 are actually bent and deformed in the X-axis direction by the distance L. That is, in the comparative example, when the movable mirror 1011 moves in the Z-axis direction, the first torsion bar 1157 and the second torsion bar 1158 are twisted in a bent state. For this reason, nonlinearity occurs in torsional deformation of the first torsion bar 1157 and the second torsion bar 1158. When such nonlinearity exists, there is concern that the control characteristic of the movable mirror 11 may be deteriorated as will be described later.

In contrast, as illustrated in FIG. 7, when the movable mirror 11 in the optical device 10 moves in the Z-axis direction, the nonlinearity relaxation spring 159 is deformed in the X-axis direction so as to be larger than the first torsion bar 157 and the second torsion bar 158 while being deformed around the Y-axis direction so as to be smaller than the first torsion bar 157 and the second torsion bar 158. Accordingly, it is possible to suppress the first torsion bar 157 and the second torsion bar 158 from being bent and deformed in the X-axis direction. As a result, it is possible to suppress nonlinearity in torsional deformation of the first torsion bar 157 and the second torsion bar 158.

Further, in the optical device 10, the second comb electrode 162 is disposed along the outer edge of the movable mirror 11. Accordingly, it is possible to secure a distance from a connection position with respect to the base 12 in the first elastic support portion 14 and the second elastic support portion 15 to a position in which an electrostatic force generated by the first comb electrode 161 and the second comb electrode 162 is exerted and to secure an arrangement area of the second comb electrode 162. As a result, it is possible to highly efficiently use the electrostatic force generated by the first comb electrode 161 and the second comb electrode 162 as the driving force of the movable mirror 11 and to increase the movement amount of the movable mirror 11. Here, as described above, nonlinearity in torsional deformation of the torsion bar easily occurs as the movement amount of the movable mirror 11 increases. In contrast, as described above, in the optical device 10, the occurrence of nonlinearity can be suppressed by the nonlinearity relaxation springs 149 and 159. Thus, according to the optical device 10, it is possible to suppress the occurrence of nonlinearity in torsional deformation of the first torsion bars 147 and 157 and the second torsion bars 148 and 158 while increasing the movement amount of the movable mirror 11.

In the optical device 10, the first comb finger 161a and the second comb finger 162a which are adjacent to each other face each other in the X-axis direction. Accordingly, it is possible to efficiently dispose the second comb electrode 162 and to appropriately secure the magnitude of the electrostatic force generated by the first comb electrode 161 and the second comb electrode 162.

In the optical device 10, the length of the plate-shaped portion 149a in the Y-axis direction is longer than the length of the first torsion bar 147 and the second torsion bar 148. Similarly, the length of the plate-shaped portion 159a in the Y-axis direction is longer than the length of the first torsion bar 157 and the second torsion bar 158. Accordingly, it is possible to effectively suppress the occurrence of nonlinearity in torsional deformation of the first torsion bars 147 and 157 and the second torsion bars 148 and 158.

In the optical device 10, the first elastic support portion 14 includes the second torsion bar 148 connected between the base 12 and the end portion 141d of the first lever 141. Similarly, the second elastic support portion 15 includes the second torsion bar 158 connected between the base 12 and the end portion 151d of the first lever 151. Accordingly, it is possible to further increase the movement amount of the movable mirror 11.

Figure 8:
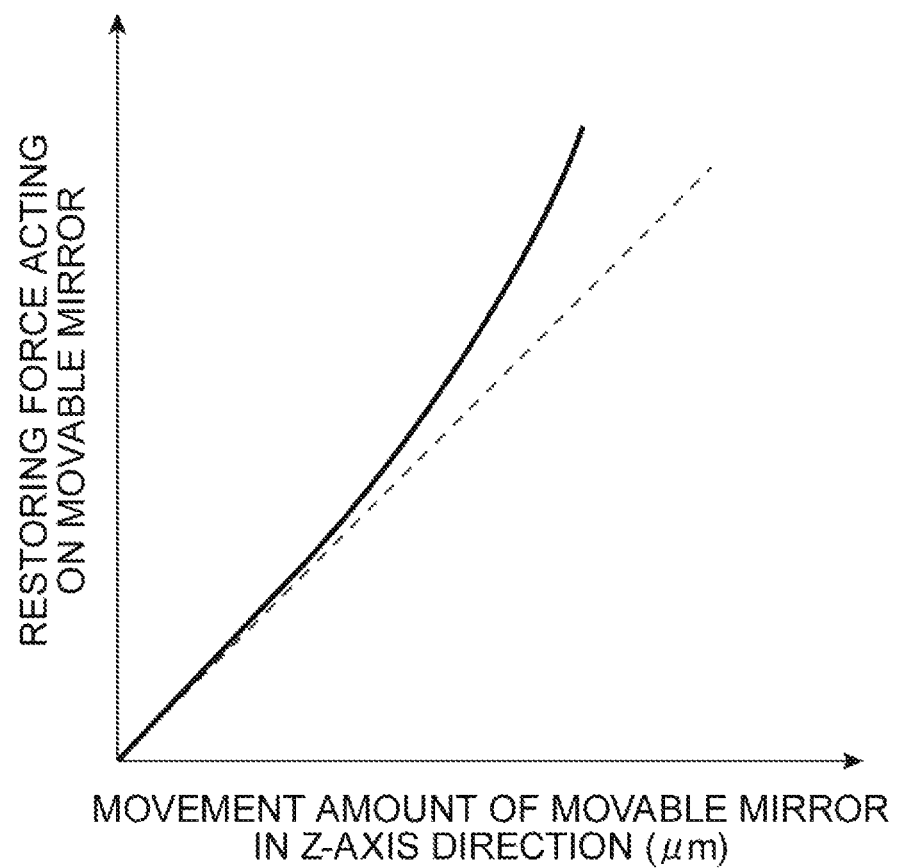
FIG. 8 is a graph showing a relationship between a movement amount of the movable mirror and a restoring force acting on the movable mirror when there is nonlinearity or not.
Figure 9:
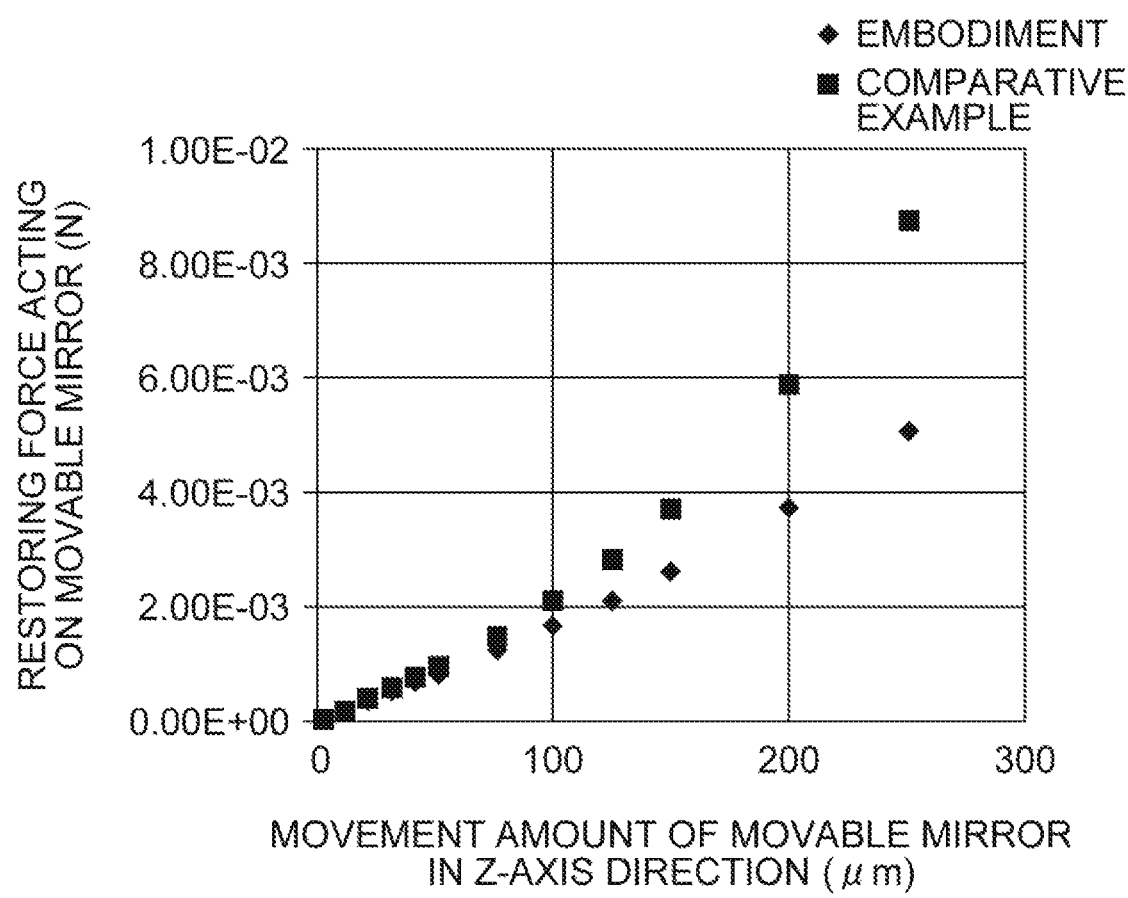
FIG. 9 is a graph showing a movement amount of the movable mirror and a restoring force acting on the movable mirror of an embodiment and a comparative example.

Here, a problem that occurs when nonlinearity exists in the torsional deformation of the first torsion bars 147 and 157 and the second torsion bars 148 and 158 will be described with reference to FIGS. 8 to 11. In FIG. 8, a relationship between the restoring force acting on the movable mirror 11 and the movement amount of the movable mirror 11 when there is no nonlinearity is indicated by a dashed line and the relationship when there is nonlinearity is indicated by a solid line. As shown in FIGS. 8 and 9, if the movement amount of the movable mirror 11 in the Z-axis direction increases when nonlinearity does not exist (decreases) as in the optical device 10, the restoring force acting on the movable mirror 11 linearly increases. Meanwhile, if the movement amount of the movable mirror 11 in the Z-axis direction increases when there is nonlinearity as in the comparative example, the restoring force acting on the movable mirror 11 increases at an accelerated rate so as to be larger than that of the optical device 10. A spring having characteristics as in the comparative example is called a hardened spring (or gradually hardened spring).

Figure 10:
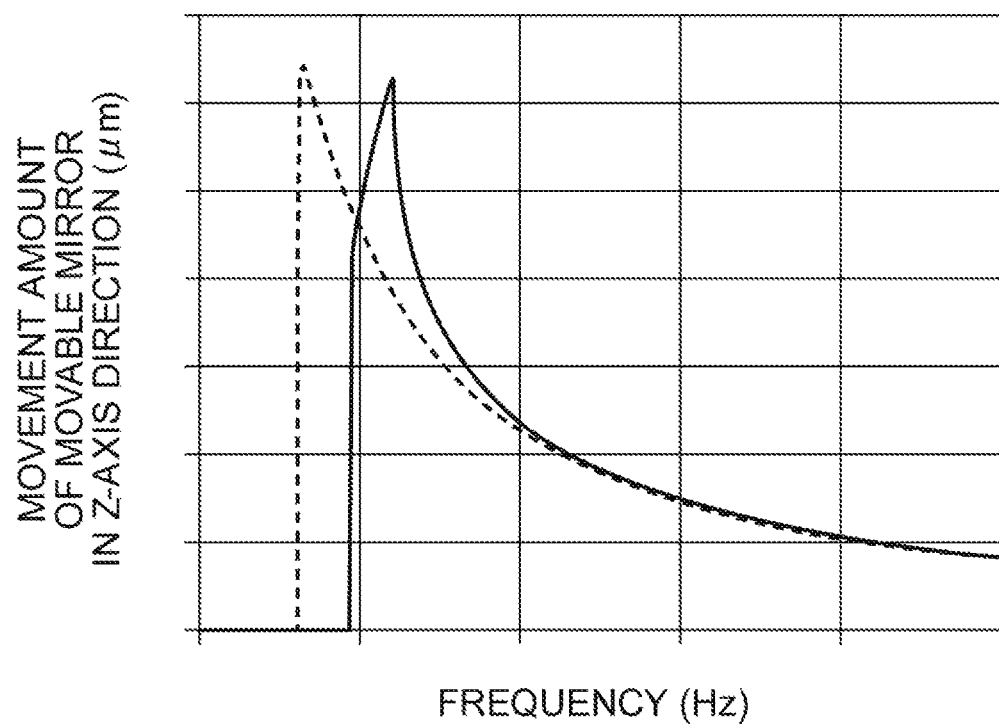
FIG. 10 is a graph showing a relationship between a driving frequency and a movement amount of the movable mirror when nonlinearity is small.
Figure 11:
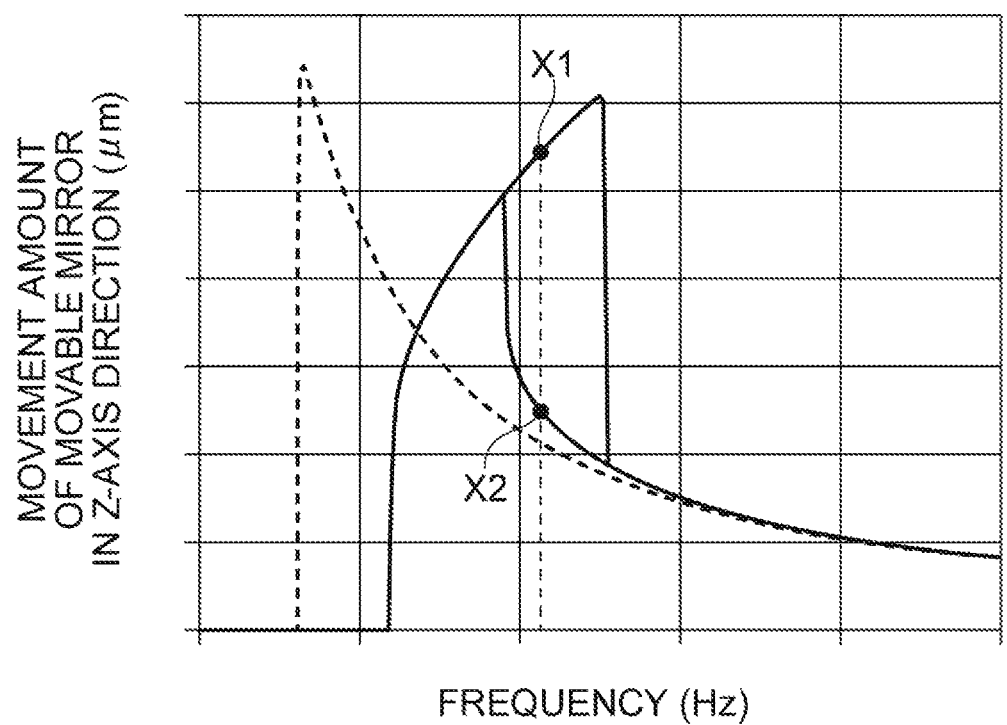
FIG. 11 is a graph showing a relationship between a driving frequency and a movement amount of the movable mirror when nonlinearity is large.

FIGS. 10 and 11 are graphs showing a relationship between the driving frequency and the movement amount of the movable mirror 11 when nonlinearity is small and large. In FIGS. 10 and 11, a frequency characteristic when there is no nonlinearity is indicated by a dashed line and a frequency characteristic when there is nonlinearity is indicated by a solid line. As shown in FIGS. 10 and 11, when there is nonlinearity, the frequency characteristic is distorted and the movement amount of the movable mirror 11 at the peak of the graph is small as compared with a case in which there is no nonlinearity. For that reason, a large force is necessary when there is nonlinearity in order to move the movable mirror 11 by the same movement amount and hence the control characteristic of the movable mirror 11 is deteriorated. Furthermore, FIGS. 10 and 11 show an example of the frequency characteristic, but the frequency characteristic is not limited thereto.

Further, as shown in FIG. 11, when the nonlinearity increases, there may be two solutions (multiple solutions) of the point X1 and the point X2 for the same driving frequency. In this case, the behavior of the movable mirror 11 is different for the case of performing a control of increasing the driving frequency from a relatively small initial value and the case of performing a control of decreasing the driving frequency from a relatively large initial value. Further, when a continuous operation is performed in a frequency range including a frequency corresponding to multiple solutions, the movement amount of the movable mirror 11 becomes a movement amount corresponding to the point X1 or corresponding to the point X2 due to external influences such as impact and vibration and hence the operation becomes unstable due to the movement amount. For that reason, because the control is complex, there is concern that the control characteristic of the movable mirror 11 may be deteriorated. Further, when there is nonlinearity, a third harmonic (a frequency component three times the target frequency) is added to the operation waveform when the operation waveform of the movable mirror 11 is controlled, for example, in a sine wave shape and hence the operation waveform cannot be controlled in a desired shape. Accordingly, there is concern that the control characteristic of the movable mirror 11 may also be deteriorated. In this way, when there is nonlinearity in torsional deformation of the first torsion bars 147 and 157 and the second torsion bars 148 and 158, there is concern that the control characteristic of the movable mirror 11 may be deteriorated. In contrast, as described above, according to the optical device 10, it is possible to suppress the occurrence of nonlinearity and to suppress deterioration in the control characteristic of the movable mirror 11.

MODIFIED EXAMPLE

As described above, an embodiment of the present disclosure has been described, but the present disclosure is not limited to the above-described embodiment. For example, the materials and shapes of each component are not limited to the materials and shapes described above and various materials and shapes can be employed. As an example, the drive unit 13 may include another elastic support portion connected to the base 12 and the movable mirror 11 in addition to the first elastic support portion 14 and the second elastic support portion 15.

As in the optical module 1, the fixed mirror 21 may be disposed not only at a position right below the first optical function unit 17 but also at a position right below the second optical function unit 18. With this configuration, it is possible to suppress deterioration in the movable performance of the movable mirror 11 and an increase in the size of the entire device while realizing multi-functionality of the device by using the second optical function unit 18 in the same manner as the first optical function unit 17. The fixed mirror 21 may be provided on the main surface 12a of the device layer 52. In this case, the light passage opening portion functioning as the first optical function unit 17 and the second optical function unit 18 is not formed in the SOI substrate 50.

Figure 12:
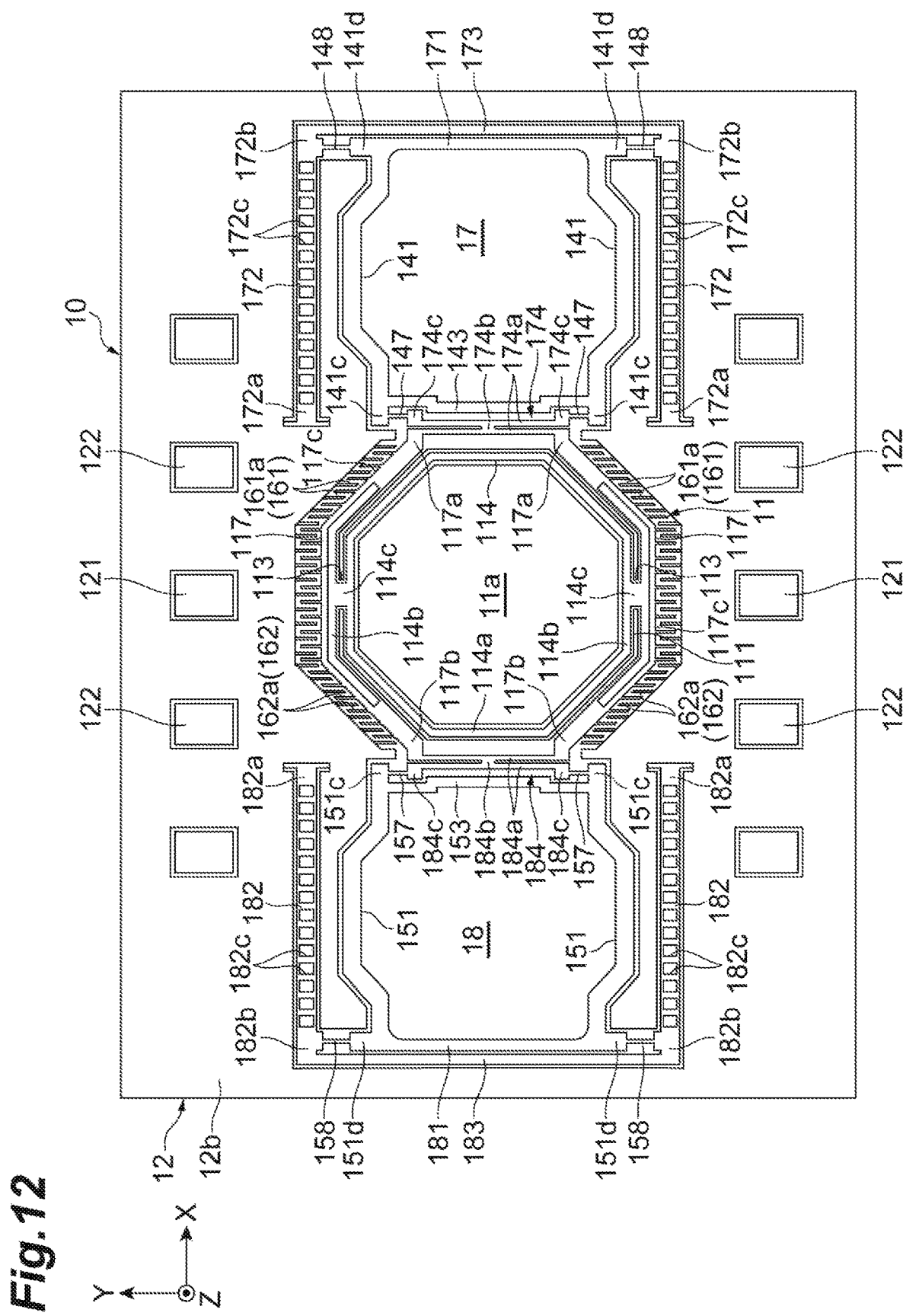
FIG. 12 is a plan view of a first modified example of the optical device.

The optical device 10 may be configured as in a first modified example illustrated in FIG. 12. In the first modified example, the movable mirror 11 does not include the pair of brackets 116 and includes a pair of electrode support members 117 instead of the annular portion 112. The pair of electrode support members 117 are formed by the device layer 52. The pair of electrode support members 117 are respectively disposed at one side and the other side of the Y-axis direction with respect to the main body 111. Each electrode support member 117 extends along the outer edge of the main body 111. One end portion 117a of each electrode support member 117 is located at the side of the first optical function unit 17 and the other end portion 117b of each electrode support member 117 is located at the side of the second optical function unit 18. In the first modified example, the pair of second comb electrodes 162 are respectively provided in the outer surfaces 117c and 117c of the electrode support members 117 in the Y-axis direction. The main body 111 has an octagonal shape when viewed from the Z-axis direction. A pair of the outer wall portions 114b are provided in the surfaces at the side of the main surface 12b in the electrode support members 117 so as to be located at the intermediate portion between the end portion 117a and the end portion 117b of each electrode support member 117.

In the first modified example, the first elastic support portion 14 includes the pair of first levers 141, the link 143, the pair of first torsion bars 147, the pair of second torsion bars 148, a link 171, a pair of second levers 172, a link 173, and a nonlinearity relaxation spring 174. The link 171 is laid between the end portions 141d of the first levers 141. The pair of second levers 172 extend along a plane perpendicular to the Z-axis direction from both sides of the first optical function unit 17 in the Y-axis direction toward the movable mirror 11. The pair of second levers 172 extend along the X-axis direction at the outside of the pair of first levers 141 when viewed from the Z-axis direction. The end portion 172a at the side of the movable mirror 11 in each second lever 172 is connected to the base 12. The end portion 172b at the side opposite to the movable mirror 11 in each second lever 172 is connected to the end portion 141d of the first lever 141 through the second torsion bar 148. Each second lever 172 is provided with a plurality of removal portions 172c. The removal portion 172c is, for example, a through-hole which penetrates the second lever 172 in the Z-axis direction. The link 173 is laid between the end portions 172b at the side opposite to the movable mirror 11 in the second levers 172. Each of the links 171 and 173 extends along the Y-axis direction when viewed from the Z-axis direction. In the first modified example, the first optical function unit 17 is not a light passage opening portion formed in the SOI substrate 50, but a light passage opening portion defined by the pair of first levers 141, the link 143, and the link 171.

The nonlinearity relaxation spring 174 is connected between the movable mirror 11 and the pair of first torsion bars 147. The nonlinearity relaxation spring 174 includes a pair of facing portions 174a and a connection portion 174b connecting the pair of facing portions 174a. Each facing portion 174a has, for example, a flat plate shape perpendicular to the X-axis direction or a bar shape extending in the Y-axis direction. The pair of facing portions 174a face each other in the X-axis direction. The length of the facing portion 174a in the Y-axis direction is longer than each of the length of the first torsion bar 147 and the length of the second torsion bar 148. The connection portion 174b connects the facing surfaces of the pair of facing portions 174a to each other. Both end portions of one facing portion 174a in the Y-axis direction are respectively connected to the end portion 117a of the electrode support member 117. Both end portions of the other facing portion 174a in the Y-axis direction are respectively provided with a protrusion portion 174c protruding toward the first optical function unit 17. The other facing portion 174a is connected to the first torsion bar 147 in each protrusion portion 174c.

The second elastic support portion 15 includes the pair of first levers 151, the link 153, the pair of first torsion bars 157, the pair of second torsion bars 158, a link 181, a pair of second levers 182, a link 183, and a nonlinearity relaxation spring 184. The link 181 is laid between the end portions 151d of the first levers 151. The pair of second levers 182 extend along a plane perpendicular to the Z-axis direction from both sides of the second optical function unit 18 in the Y-axis direction toward the movable mirror 11. The pair of second levers 182 extend along the X-axis direction at the outside of the pair of first levers 151 when viewed from the Z-axis direction. The end portion 182a at the side of the movable mirror 11 in each second lever 182 is connected to the base 12. The end portion 182b at the side opposite to the movable mirror 11 in each second lever 182 is connected to the end portion 151d of the first lever 151 through the second torsion bar 158. Each second lever 182 is provided with a plurality of removal portions 182c. The removal portion 182c is, for example, a through-hole which penetrates the second lever 182 in the Z-axis direction. The link 183 is laid between the end portions 182b at the side opposite to the movable mirror 11 in the second levers 182. Each of the links 181 and 183 extends along the Y-axis direction when viewed from the Z-axis direction. In the first modified example, the second optical function unit 18 is not a light passage opening portion formed in the SOI substrate 50, but a light passage opening portion defined by the pair of first levers 151, the link 153, and the link 181.

The nonlinearity relaxation spring 184 is connected between the movable mirror 11 and the pair of first torsion bars 157. The nonlinearity relaxation spring 184 includes a pair of facing portions 184a and a connection portion 184b connecting the pair of facing portions 184a to each other. Each facing portion 184a has, for example, a flat plate shape perpendicular to the X-axis direction or a bar shape extending in the Y-axis direction. The pair of facing portions 184a face each other in the X-axis direction. The length of the facing portion 184a in the Y-axis direction is longer than each of the length of the first torsion bar 157 and the length of the second torsion bar 148. The connection portion 184b connects the facing surfaces of the pair of facing portions 184a to each other. Each of both end portions of one facing portion 184a in the Y-axis direction is connected to the end portion 117b of the electrode support member 117. Each of both end portions of the other facing portion 184a in the Y-axis direction is provided with a protrusion portion 184c protruding toward the second optical function unit 18. The other facing portion 184a is connected to the first torsion bar 157 in each protrusion portion 184c.

Figure 13:
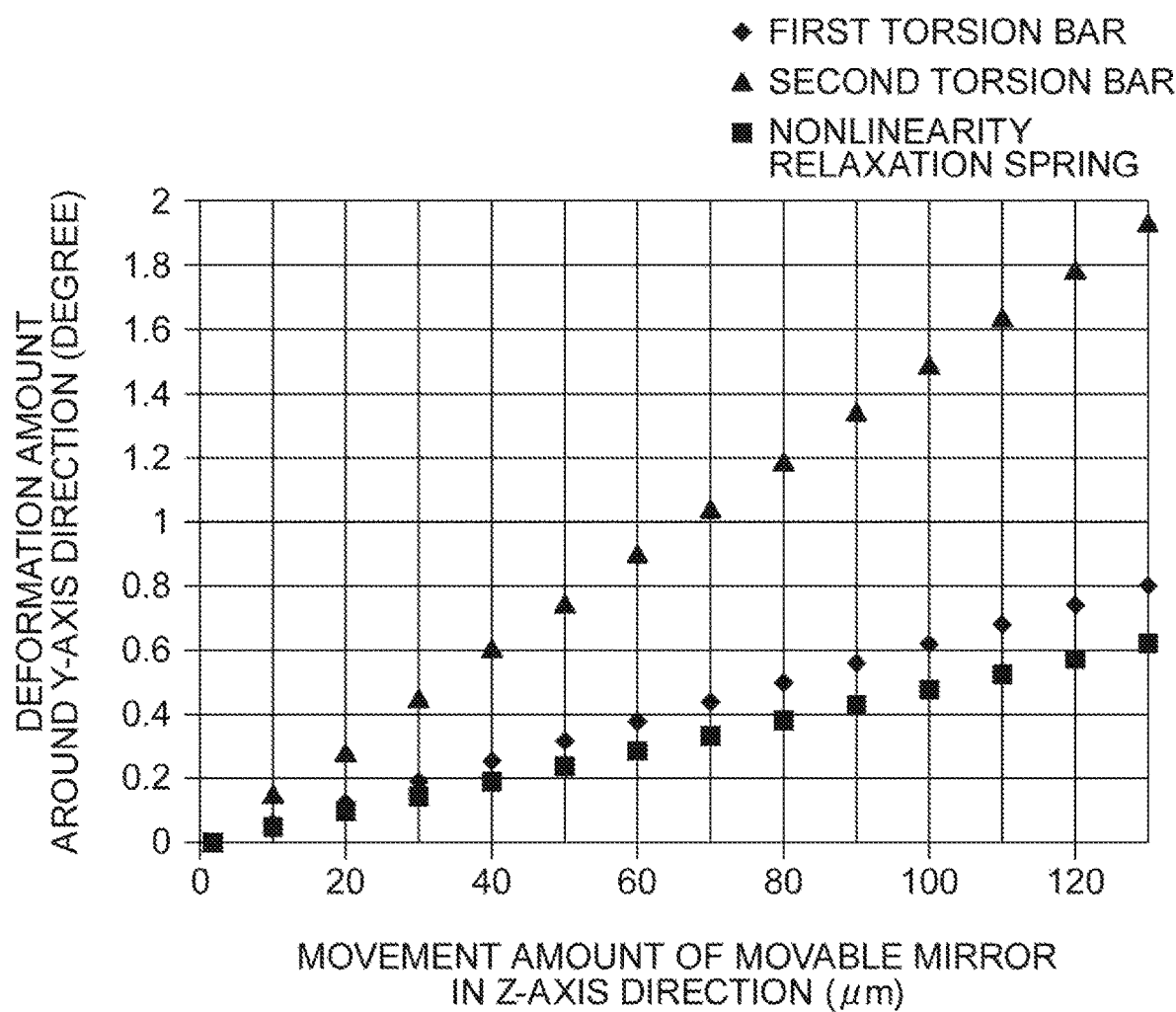
FIG. 13 is a graph showing a change in deformation amount of a torsion bar and a nonlinearity relaxation spring around the Y-axis direction with respect to a movement amount of a movable mirror of the first modified example.
Figure 14:
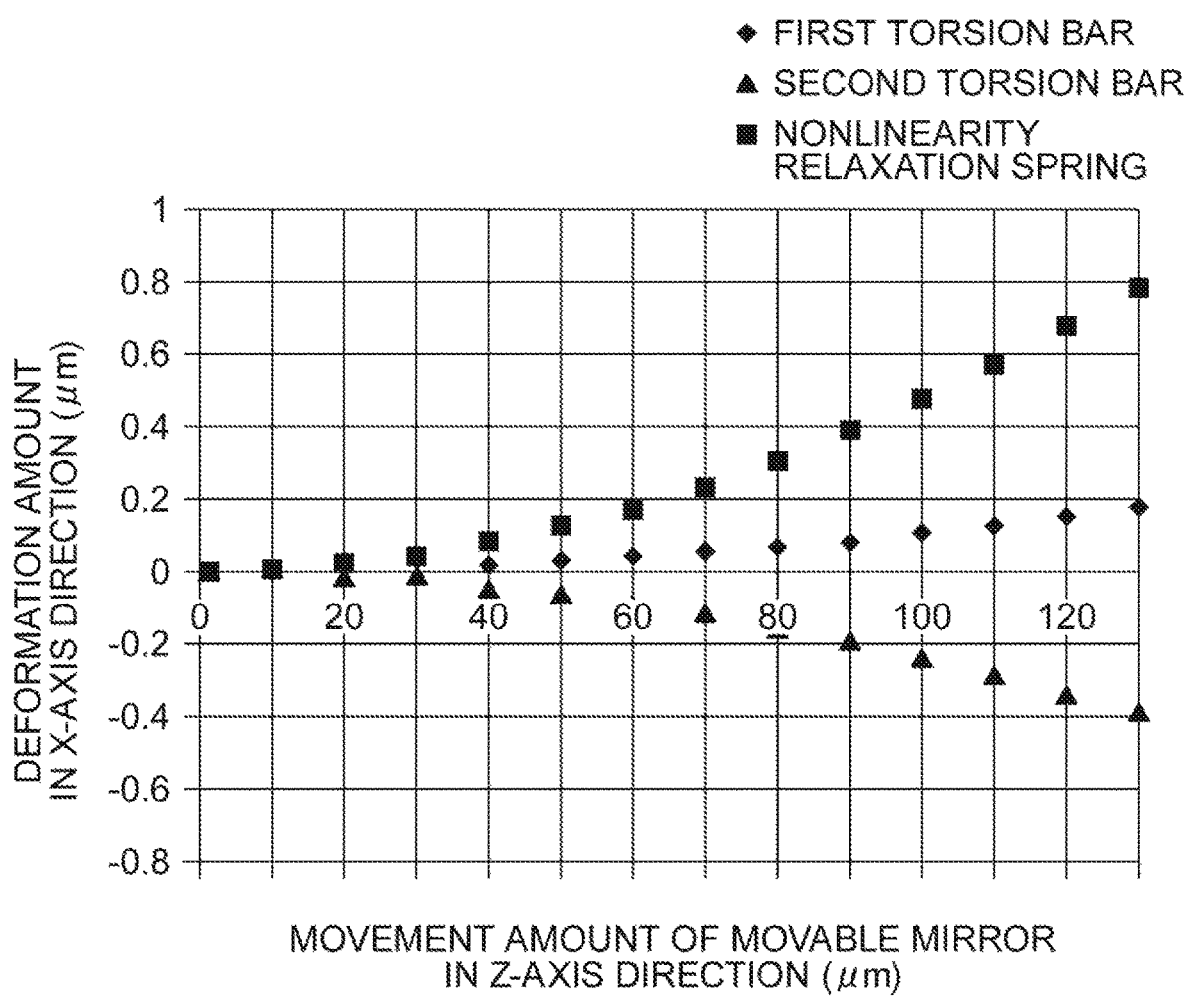
FIG. 14 is a graph showing a change in deformation amount of the torsion bar and the nonlinearity relaxation spring in the X-axis direction with respect to the movement amount of the movable mirror in the first modified example.

FIG. 13 is a graph showing a change in deformation amount of the first torsion bar 147, the second torsion bar 148, and the nonlinearity relaxation spring 174 around the Y-axis direction with respect to the movement amount of the movable mirror 11 in the Z-axis direction. FIG. 14 is a graph showing a change in deformation amount of the first torsion bar 147, the second torsion bar 148, and the nonlinearity relaxation spring 174 in the X-axis direction with respect to the movement amount of the movable mirror 11 in the Z-axis direction. Additionally, the deformation amount of the nonlinearity relaxation spring 174 around the Y-axis direction means, for example, the entire deformation amount around the Y-axis direction including the pair of facing portions 174a and the connection portion 174b. The deformation amount of the nonlinearity relaxation spring 174 in the X-axis direction means, for example, the entire deformation amount in the X-axis direction including the pair of facing portions 174a and the connection portion 174b.

As shown in FIG. 13, when the movable mirror 11 moves in the Z-axis direction, each of the first torsion bar 147, the second torsion bar 148, and the nonlinearity relaxation spring 174 is twisted and deformed in the same direction around the Y-axis direction. When the movement amount of the movable mirror 11 increases, the deformation amount of each of the first torsion bar 147, the second torsion bar 148, and the nonlinearity relaxation spring 174 around the Y-axis direction linearly increases. Comparing the deformation amounts of respective members around the Y-axis direction, when the movement amount of the movable mirror 11 is the same, the deformation amount of the first torsion bar 147 is much smaller than the deformation amount of the second torsion bar 148 and the deformation amount of the nonlinearity relaxation spring 174 is smaller than each of the deformation amount of the first torsion bar 147 and the deformation amount of the second torsion bar 148.

As shown in FIG. 14, when the movable mirror 11 moves in the Z-axis direction, the nonlinearity relaxation spring 174 and the first torsion bar 147 are deformed toward one side in the X-axis direction and the second torsion bar 148 is deformed toward the other side in the X-axis direction. When the movement amount of the movable mirror 11 increases, the defamation amount of the first torsion bar 147, the second torsion bar 148, and the nonlinearity relaxation spring 174 in the X-axis direction increases quadratically. Comparing the deformation amounts of respective members in the X-axis direction, when the movement amount of the movable mirror 11 is the same, the deformation amount of the first torsion bar 147 is smaller than the deformation amount of the second torsion bar 148 and the deformation amount of the nonlinearity relaxation spring 174 is larger than each of the deformation amount of the first torsion bar 147 and the deformation amount of the second torsion bar 148.

In this way, the nonlinearity relaxation spring 174 is configured so that the deformation amount of the nonlinearity relaxation spring 174 around the Y-axis direction is smaller than the deformation amount of each of the torsion bars 147 and 148 around the Y-axis direction and the deformation amount of the nonlinearity relaxation spring 174 in the X-axis direction is larger than the deformation amount of each of the torsion bars 147 and 148 in the X-axis direction while the movable mirror 11 moves in the Z-axis direction. Similarly, the nonlinearity relaxation spring 184 is configured so that the deformation amount of the nonlinearity relaxation spring 184 around the Y-axis direction is smaller than the deformation amount of each of the torsion bars 157 and 158 around the Y-axis direction and the deformation amount of the nonlinearity relaxation spring 184 in the X-axis direction is larger than the deformation amount of each of the torsion bars 157 and 158 in the X-axis direction while the movable mirror 11 moves in the Z-axis direction.

Also by such a first modified example, similarly to the above-described embodiment, it is possible to suppress the occurrence of nonlinearity in torsional deformation of the first torsion bars 147 and 157 and the second torsion bars 148 and 158 while increasing the movement amount of the movable mirror 11. Further, in the first modified example, the first elastic support portion 14 includes the second lever 172 provided with the removal portion 172c. Similarly, the second elastic support portion 15 includes the second lever 182 provided with the removal portion 182c. Accordingly, it is possible to further increase the movement amount of the movable mirror 11.

The optical device 10 may be configured as in a second modified example illustrated in FIG. 15. The second modified example is different from the first modified example in that the second lever 172 is not provided with the removal portion 172c and the second lever 182 is not provided with the removal portion 182c. Also by such a first modified example, similarly to the above-described embodiment, it is possible to suppress the occurrence of nonlinearity in torsional deformation of the first torsion bars 147 and 157 and the second torsion bars 148 and 158 while increasing the movement amount of the movable mirror 11. Further, because the removal portions 172c and 182c are not provided, it is possible to improve the vibration impact resistance in the Y-axis direction and to reduce the influence on the operation due to the dimensional variation caused by the manufacturing.

The nonlinearity relaxation spring 149 is not limited to one of the above-described embodiment. For example, the length of the plate-shaped portion 149a in the Y-axis direction may be equal to or smaller than the length of the torsion bars 147 and 148. The width of the plate-shaped portion 149a (the length in the X-axis direction) may be equal to or larger than the width of the torsion bars 147 and 148. The plate-shaped portion 149a may extend so as to be inclined with respect to the Z-axis direction or the Y-axis direction. The nonlinearity relaxation spring 149 may include single or three or more plate-shaped portions 149a. In the above-described embodiment, the pair of nonlinearity relaxation springs 149 are provided in the first elastic support portion 14, but single or three or more nonlinearity relaxation springs 149 may be provided. The same applies to the nonlinearity relaxation spring 159.

In the above-described embodiment, when the annular portion 112 is not provided, the second comb electrode 162 may be provided in the outer surface of the main body 111 in the Y-axis direction. Also in this case, the second comb electrode 162 is disposed along the outer edge of the movable mirror 11. The second comb electrode 162 may be disposed not only in the movable mirror 11 but also the first elastic support portion 14 and the second elastic support portion 15. In this case, the second comb electrode 162 provided in the first elastic support portion 14 and the second elastic support portion 15 may not be disposed along the outer edge of the movable mirror 11. That is, the second comb electrode 162 may be provided in at least the movable mirror 11. The first comb finger 161a and the second comb finger 162a which are adjacent to each other may face each other in the X-axis direction and at least one of the first comb fingers 161a and the second comb fingers 162a may extend so as to be inclined with respect to a plane perpendicular to the X-axis direction. Alternatively, at least one of the first comb fingers 161a and the second comb fingers 162a may be bent in an arcuate shape when viewed from the Z-axis direction.

The optical device 10 may include a movable portion provided with another optical function unit other than the mirror surface 11a instead of the movable mirror 11. As another optical function unit, for example, a lens or the like can be exemplified. The optical module 1 is not limited to one constituting the FTIR, but may be one constituting another optical system. The first torsion bars 147 and 157 and the second torsion bars 148 and 158 may be twisted and deformed and may have any shape such as a plate shape or a bar shape.

REFERENCE SIGNS LIST

10: optical device, 11: movable mirror (movable portion), 11a: mirror surface (optical function unit), 12: base, 14: first elastic support portion, 15: second elastic support portion, 141, 151: first lever, 141c, 151c: end portion (one end portion), 141d, 151d: end portion (other end portion), 147, 157: first torsion bar, 148, 158: second torsion bar, 149, 159, 174, 184: nonlinearity relaxation spring, 149a, 159a: plate-shaped portion, 161: first comb electrode, 161a: first comb finger, 162: second comb electrode, 162a: second comb finger, 172, 182: second lever, 172a, 182a: end portion (one end portion), 172b, 182b: end portion (other end portion), 172c: removal portion, 174a, 184a: facing portion, 174b, 184b: connection portion.

The invention claimed is:

1. An optical device comprising:
   a base;
   a movable portion which includes an optical function unit;
   an elastic support portion which is connected between the base and the movable portion and supports the movable portion so that the movable portion is movable along a first direction;
   a first comb electrode which is provided to the base and includes a plurality of first comb fingers; and
   a second comb electrode which is provided to at least the movable portion and includes a plurality of second comb fingers alternately arranged with the plurality of first comb fingers,
   wherein the elastic support portion includes a torsion bar extending along a second direction perpendicular to the first direction and a nonlinearity relaxation spring connected between the torsion bar and the movable portion,
   wherein the nonlinearity relaxation spring is configured so that a deformation amount of the nonlinearity relaxation spring around the second direction is smaller than a deformation amount of the torsion bar around the second direction and a deformation amount of the nonlinearity relaxation spring in a third direction perpendicular to the first direction and the second direction is larger than a deformation amount of the torsion bar in the third direction while the movable portion moves in the first direction, and
   wherein the second comb electrode is disposed along an outer edge of the movable portion.

2. The optical device according to claim 1,
   wherein the first comb finger and the second comb finger which are adjacent to each face each other in the third direction.

3. The optical device according to claim 1,
   wherein the nonlinearity relaxation spring includes a plate-shaped portion and the length of the plate-shaped portion in the second direction is longer than the length of the torsion bar.

4. The optical device according to claim 1,
   wherein the nonlinearity relaxation spring includes a pair of facing portions facing each other and a connection portion connecting the pair of facing portions to each other.

5. The optical device according to claim 1,
   wherein the elastic support portion further includes a first lever connected to the nonlinearity relaxation spring through the torsion bar at one end portion and a torsion bar connected between the base and the other end portion of the first lever.

6. The optical device according to claim 5,
   wherein the elastic support portion further includes a second lever connected to the base at one end portion and connected to the other end portion of the first lever through the torsion bar at the other end portion, and
   wherein the second lever is provided with a removal portion.

7. The optical device according to claim 5,
   wherein the elastic support portion further includes a second lever connected to the base at one end portion and connected to the other end portion of the first lever through the torsion bar at the other end portion, and
   wherein the first lever and the second lever are not provided with a removal portion.

* * * * *